United States Patent
Kahen

(10) Patent No.: US 9,153,731 B2
(45) Date of Patent: Oct. 6, 2015

(54) COLLOIDAL NANOCRYSTALS AND METHOD OF MAKING

(71) Applicant: The Research Foundation for the State University of New York, Amherst, NY (US)

(72) Inventor: Keith Kahen, Rochester, NY (US)

(73) Assignee: The Research Foundation for the State University of New York, Amherst, NY (US)

( * ) Notice: Subject to any disclaimer, the term of this patent is extended or adjusted under 35 U.S.C. 154(b) by 0 days.

(21) Appl. No.: 14/454,293

(22) Filed: Aug. 7, 2014

(65) Prior Publication Data

US 2015/0041759 A1    Feb. 12, 2015

Related U.S. Application Data

(60) Provisional application No. 61/863,016, filed on Aug. 7, 2013.

(51) Int. Cl.
| | |
|---|---|
| *H01L 29/06* | (2006.01) |
| *H01L 31/00* | (2006.01) |
| *H01L 33/00* | (2010.01) |
| *H01L 33/06* | (2010.01) |

(Continued)

(52) U.S. Cl.
CPC ............... *H01L 33/002* (2013.01); *C09C 1/00* (2013.01); *C09K 11/00* (2013.01); *H01L 33/005* (2013.01); *H01L 33/06* (2013.01)

(58) Field of Classification Search
CPC .......... B82Y 30/00; C30B 7/00; C09K 11/00; C09C 1/00; H01L 33/06; H01L 33/005
USPC ......................................... 257/14, 344; 438/47
See application file for complete search history.

(56) References Cited

U.S. PATENT DOCUMENTS

| | | | |
|---|---|---|---|
| 6,322,901 B1 | 11/2001 | Bawendi et al. | |
| 8,420,155 B2 | 4/2013 | Nie et al. | |

(Continued)

OTHER PUBLICATIONS

Alivisatos, A.P. et al., Electron-vibration coupling in semiconductor clusters studied by resonance Raman spectroscopy, The Journal of Chemical Physics, 90, 3463 (1989); doi: 10.1063/1.455855.

(Continued)

*Primary Examiner* — Khanh Tuan Nguyen
(74) *Attorney, Agent, or Firm* — Woods Oviatt Gilman LLP; Katherine H. McGuire, Esq.; Douglas R. Smith, Esq.

(57) ABSTRACT

A tight confinement nanocrystal comprises a homogeneous center region having a first composition and a smoothly varying region having a second composition wherein a confining potential barrier monotonically increases and then monotonically decreases as the smoothly varying region extends from the surface of the homogeneous center region to an outer surface of the nanocrystal. A method of producing the nanocrystal comprises forming a first solution by combining a solvent and at most two nanocrystal precursors; heating the first solution to a nucleation temperature; adding to the first solution, a second solution having a solvent, at least one additional and different precursor to form the homogeneous center region and at most an initial portion of the smoothly varying region; and lowering the solution temperature to a growth temperature to complete growth of the smoothly varying region.

9 Claims, 10 Drawing Sheets

(51) Int. Cl.
*C09K 11/00* (2006.01)
*C09C 1/00* (2006.01)

(56) References Cited

U.S. PATENT DOCUMENTS

| | | |
|---|---|---|
| 8,784,703 B2 | 7/2014 | Kahen et al. |
| 2010/0140586 A1* | 6/2010 | Char et al. .................... 257/14 |
| 2013/0092883 A1 | 4/2013 | Kahen et al. |

OTHER PUBLICATIONS

Murray, C.B., et al., Synthesis and Characterization of Monodisperse Nanocrystals and Close-Packed Nanocrystal Assemblies, Annual Reviews, 2000. 30:545-610.
Parr, R.G., et al., Electrophilicity Index, J. Am. Chem. Soc., 1999, 121, 1922-1924.
Hines, M.A. & Guyot-Sionnest, P., Synthesis and Characterization of Strongly Luminescing ZnS-Capped CdSe Nanocrystals, J. Phys. Chem., 1996, 100, 468-471.
Battaglia, D. & Peng, X., Formation of High Quality InP and InAs Nanocrystals in a Noncoordinating Solvent, Nano Letters, 2002, vol. 2, No. 9, 1027-1030.
Salvador, M.R. et al., Exciton-photon coupling and disorder in the excited states of CdSe colloidal quantum dots, The Journal of Chemical Physics, 125, 184709 (2006); doi: 10.1063/1.2363190.
Nicklas, J.W. & Wilkins, J.W., Accurate ab initio predictions of III-V direct-indirect band gap crossovers, Applied Physics Letters, 97, 091902 (2010); doi: 10.1063/1.3485297.
Masala, O. & Seshadri, R., Synthesis Routes for Large Volumes of Nanoparticles, Annual Reviews, 2004. 34:41-81, doi: 10.1146/annurev.matsci.34.052803.090949.
Ryu, E., et al., Step-Wise Synthesis of InP/ZnS Core-Shell Quantum Dots and the Role of Zinc Acetate, Chemistry of Materials, vol. 21, No. 4, Feb. 24, 2009.
Pradhan, N. & Peng, X., Efficient and Color-Tunable Mn-Doped ZnSe Nanocrystal Emitters: Control of Optical Performance via Greener Synthetic Chemistry, J. Am. Chem. Soc., 2007, 129, 3339-3347.
Harris, D.K. & Bawendi, M.G., Improved Precursor Chemistry for the Synthesis of III-V Quantum Dots, J. Am. Chem. Soc., 2012, 134, 20211-20213.
Chin, P.T.K., et al., Highly Luminescent CdTe/CdSe Colloidal Heteronanocrystals with Temperature-Dependent Emission Color, J. Am. Chem. Soc., 2007, 129, 14880-14886.
Xie, R., et al., Nucleation Kinetics vs Chemical Kinetics in the Initial Formation of Semiconductor Nanocrystals, J. Am. Chem. Soc., 2009, 131, 15457-15466.
Kappers, M.J., et al., Ligand exchange reactions in InGaAs metalorganic vapor-phase epitaxy, Journal of Crystal Growth 191 (1998) 332-340.
Narayanaswamy, A., et al., Temperature Dependence of the Photoluminescence of InP/ZnS Quantum Dots, J. Phys. Chem. C, 2008, 112, 6775-6780.
Sagar, D.M., et al., State-Resolved Exciton-Phonon Couplings in CdSe Semiconductor Quantum Dots, The Journal of Physical Chemistry C, 2008, 112, 9124-9127.
Kappers, M.J., et al., Effects of Ligand Exchange Reactions on the Composition of $Cd_{1-y}Zn_yTe$ Grown by Metalorganic Vapor-Phase Epitaxy, J. Phys. Chem. B, 1997, 101, 4882-4888.
Zhao, Y., et al., High-Temperature Luminescence Quenching of Colloidal Quantum Dots, ACS Nano, 2012, vol. 6, No. 10, 9058-9067.
Schmitt-Rink, S., et al., Theory of the linear and nonlinear optical properties of semiconductor microcrystallites, Physical Review B, vol. 35, No. 15, May 15, 1987.
Oron, D., et al., Multiexcitons in type-II colloidal semiconductor quantum dots, Physical Review B, vol. 75, 035330 (2007).
Brokmann, X., et al., Statistical Aging and Nonergodicity in the Fluorescence of Single Nanocrystals, Physical Review Letters, vol. 90, No. 12, Mar. 28, 2003.
Park, Y.-S., et al., Near-Unity Quantum Yields of Biexciton Emission from CdSe/CdS Nanocrystals Measured Using Single-Particle Spectroscopy, Physical Review Letters, PRL 106, 187401, May 6, 2011.
Klimov, V.I., et al., Optical Gain and Stimulated Emission in Nanocrystal Quantum Dots, Science 290, 314 (2000); doi: 10.1126/science.290.5490.314.

* cited by examiner

COLLOIDAL NANOCRYSTALS AND METHOD OF MAKING

STATEMENT REGARDING FEDERALLY SPONSORED RESEARCH

This invention was made, at least in part, with support from the Department of Energy under Grant No. DE-EE0000979. The government may have certain rights in the invention.

BACKGROUND

In developing nanocrystals, there are several issues that need to be overcome. For a number of technologically important applications of nanocrystals, such as phosphors for solid state lighting and gain material for optically-pumped cw (continuous wave) lasers, the operating temperature of the nanocrystals is significantly above room temperature. For these applications, the optical excitation power density can range from about 200 (in solid state lighting) to >50,000 (for lasing) W/cm$^2$. Typical type I CdSe-based nanocrystals lose significant quantum efficiency (QE) (about 60%) as the temperature increases from 25° C. to 150° C., as discussed by Zhao et al [ACS Nano 6, 9058 (2012)]. Pradhan et al. [N. Pradhan et al., J. Amer. Chem. Soc. 129, 3339 (2007)] found that Mn-doped ZnSe nanocrystals maintained a reasonable thermal stability up to ~250° C.

The disadvantages of this latter approach are that the peak emission wavelengths of the nanocrystals are limited by the particular choice of the dopant materials, the spectral widths of the photoluminescence (PL) are typically larger for impurity emission, and the quantum efficiency of these types of nanocrystals is below that of undoped nanocrystals. Type II (confining electrons in one material and holes in another) core-shell CdTe/CdSe nanocrystals were also determined to have reasonable temperature stability up to ~110° C. [P. Chin et al., J. Amer. Chem. Soc. 129, 14880 (2007)]. Though better than conventional nanocrystals, the reported stability falls short of the above requirements for solid state lighting. Overall, there are no nanocrystals to date which show both high temperature stability and high quantum efficiency.

In addition to thermal stability issues, nanocrystals suffer from high-optical flux saturation as a result of Auger recombination [Y. Park et al., Phys. Rev. Lett. 106, 187401 (2011)] and blinking phenomena [X. Brokmann et al., Phys. Rev. Lett. 90, 120601 (2003)]. In order to obtain optically-pumped lasing of nanocrystal materials, unwanted Auger recombination needs to be highly reduced or shutdown, at least up to an average level of 1 e-h pair per nanocrystal. Type II nanocrystals with thick shells were reported [Y. Park et al., Phys. Rev. Lett. 106, 187401 (2011)] to show substantially less saturation of the PL compared to typical nanocrystals. These results led the authors to claim that they shutdown Auger recombination in these nanocrystals. However, they were only able to attain these results for isolated nanocrystals, since the degree of flux stability varied amongst their nanocrystals.

In another report [D. Oron et al., Phys. Rev. B75, 035330 (2007)], ps-pulsed excitation was used to show that by increasing the electron-hole separation distance in type II nanocrystals, the Auger recombination time could be increased up to ~2 ns. The problem with this approach is that the oscillator strength of the direct e-h transition decreases with increasing separation distance, thus resulting in greater competition from non-radiative recombination (thus causing a reduction in the overall QE). In addition, though a 2 ns Auger lifetime is longer than typical, it still shorter than desired for type II nanocrystals. Overall, the shutdown of Auger recombination has not been demonstrated in macroscopic nanocrystal samples at room temperature, especially for the very desirable Type I (confining electrons and holes in the same material) core-shell nanocrystals.

SUMMARY OF THE INVENTION

The subject invention provides a tight confinement nanocrystal comprising (a) a homogeneous center region, which consists of a single-component, binary or ternary semiconductor and (b) a smoothly varying region, which consists of a binary, ternary or quaternary semiconductor and encompasses the homogeneous region. In the smoothly varying region, the confining potential barrier starts at ~0 at the surface of the homogeneous region, monotonically increases to its maximum, preferably closer to the surface of the homogeneous region than to the surface of the tight confinement nanocrystal, and then monotonically decreases as it reaches the surface of the tight-confinement nanocrystal. In the smoothly varying region (b), proceeding from the surface of the homogeneous region outward, the radial mole fraction(s) of some of the varying element(s) monotonically increase(s) to its/their maximum(s), preferably closer to the surface of the homogeneous region than to the surface of the tight-confinement nanocrystal, and then monotonically decrease(s) as it/they reach(es) the surface of the tight-confinement nanocrystal. Preferably, the potential barrier of the smoothly varying region does not have any discontinuities in its radial profile.

Tight confinement (Type I nanocrystals) refers to confining the electrons and holes substantially to either the homogenous region or the combined homogeneous and smoothly varying regions. The subject invention also provides a methodology for producing the above radial compositional profile. In this approach, all of the semiconductor precursors (that form the tight confinement nanocrystal) are present in the reaction flask at the beginning of the nanocrystal nucleation step, with either one or some them being injected substantially simultaneously into the flask at the start of the nucleation reaction. The precursors are chosen such that their reactivities favor the formation of the homogeneous region during the early stages of the nanocrystal growth, but quickly evolve such that their reactivities favor the growth of the smoothly varying region. The simplicity of this approach should lead to improved reproducibility of the process, in addition to lower manufacturing costs.

The inventive nanocrystals are considered colloidal since they form a colloidal solution. This is distinct from the other categories of nanocrystals which are formed by classical semiconductor growth processes, such as molecular beam epitaxy (MBE) or metal-organic chemical vapor deposition (MOCVD), where the nanocrystals are called self-assembled quantum dots.

DETAILED DESCRIPTION OF THE INVENTION

Figure 1A:
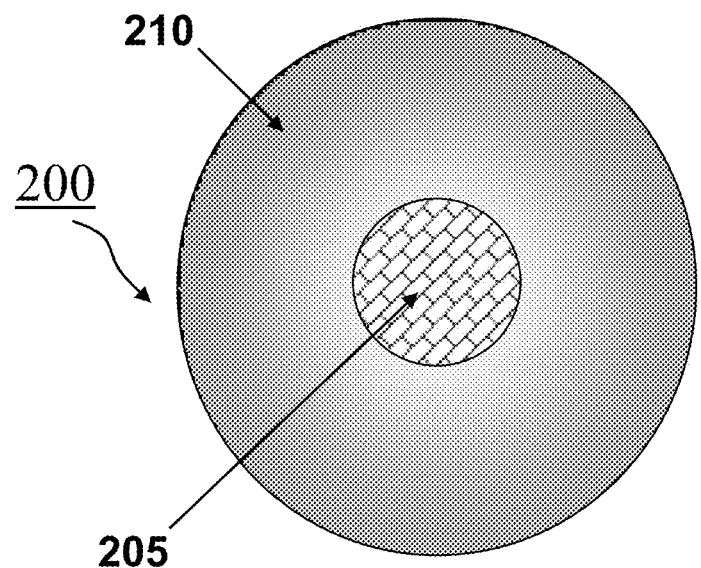
FIG. 1A is a schematic of a nanocrystal in accordance with the present invention.

Throughout this application, "electrons and holes" may refer to "excitons" and/or unbound electrons and holes.

The inventive nanocrystals demonstrate stable quantum efficiencies at elevated temperatures (at least up to 150° C.). In addition, fs-pulsed excitation measurements indicate that they enable a large reduction in the strength of the Auger response up to an average excitation level of at least 2 e-h pairs. Finally, the nanocrystals effectively show an absence of emissive thermal broadening from 25° C. to at least 150° C. Given these properties, the inventive nanocrystals can be used as advantaged on chip phosphors in solid state lighting and LED applications in order to produce higher quality light that has higher efficiency than conventional nanocrystals. Advantaged optically-pumped devices containing the inventive nanocrystals can also be formed. Some examples are optically-pumped cw-ASE (amplified spontaneous emission) devices and optically-pumped lasers. The former device can produce highly-polarized, spectrally-narrow, and spatially-coherent light. As an example, the former device can be used to make advantaged LCD displays when employed as a backlight. As is well-known in the art, the applications of the latter device would be myriad, including, for example, medical, biological, and semiconductor-based applications. The inventive nanocrystals are also highly desirable for their non-blinking characteristics in such applications as single photon emitters (for quantum computing) and for biological tracking.

The improved thermal stability of colloidal nanocrystals (as compared to bulk crystalline materials) is already evident from their higher efficiencies at room temperature; however, the problem lies in maintaining these stabilities at temperatures well above 25° C. The key physics for temperature-stable nanocrystals are: 1) preventing dissociation of the excitons, 2) preventing the electrons and holes from sampling the surface states (i.e., keeping the electrons and holes away from the nanocrystal surface so that the electron and hole wavefunctions have only minimal interactions with the surface states), and 3) minimizing the electron-phonon interaction. All three issues become more problematic at elevated temperatures, since at elevated temperatures the electron and hole wavefunctions are more extended.

There are two types of phonons, acoustic and optical; only the optical phonons will be considered since the coupling strength of the acoustic phonons is known to be small and typically prominent only at cryogenic temperatures [M. Salvador, J. Chem. Phys. 125, 184709 (2006)]. As is well known in the art [A. Alivisatos, J. Chem. Phys. 90, 3466 (1989)], the coupling to the optical phonons is minimized as the overlap between the electron and hole wavefunctions increases, thus reducing the corresponding polarization charge. Consequently in the ideal case, highly confined electrons and holes would have minimized electron-phonon interactions. However, some of the larger reported electron-phonon couplings for nanocrystals are due to trapped surface charges [D. Sagar et al., J. Phys. Chem. C112, 9124 (2008)]. The trapped charge enhances the polarization of the excited carrier distribution, resulting in enhanced electron-phonon couplings. Consequently, minimizing the electron-phonon coupling also requires that the excited electrons and holes are prevented from being trapped by the surface states.

The issues associated with trapped charge can be generalized to include any internal defects in the nanocrystals that need to be minimized in order to improve the thermal stability. Having high quantum efficiency at room-temperature is indicative of a minimum of internal defects and successful passivation of the surface states. If some of the passivation is accomplished through the use of organic ligands (which is typically the case), then high quantum efficiency at elevated temperature either requires temperature-stable organic ligands (this includes stable bonds with the semiconductor surface) or preventing the charge distribution from sampling the surface states of the nanocrystal.

A means for satisfying these requirements is to construct a nanocrystal wherein the electrons and holes are tightly confined to a center region of the nanocrystal, for which the radius of the region is much smaller than the exciton Bohr radius. For the case of a tightly confined region surrounded by infinite barriers, the energies of both the electrons and holes are dominated by their respective kinetic energies and their corresponding wavefunctions are identical [S. Schmitt-Rink et al., Phys. Rev. B35, 8113 (1987)], thus resulting in zero polarization charge. In addition, by tightly confining the electrons and holes to the center region of the nanocrystal, they are prevented from interacting with the surface region of the nanocrystal. Though the above potential barrier will minimize thermal quenching of the quantum efficiency, as will be discussed below, it will also result in enhanced Auger recombination and therefore it is not the desired compositional structure.

For some semiconductor nanocrystal systems, the Bohr radius can be quite large (34 nm in InAs, 46 nm in PbSe, and 54 nm in InSb). However, in more prototypical quantum dots, such as, CdSe and InP, the Bohr radii are 6 and 11 nm, respectively. In these cases, the tightly confined center region should have a diameter less than ~2.0 nm. As is well known in the art, forming typical core-shell nanocrystals occurs by the process of growing the cores in the 260° C. to 310° C. range, lowering the temperature to about 190° C., and then dripping in the shell precursors. The problem with this generic procedure, especially when the core diameter is less than 2.0 nm, is that the small core nanocrystals are dominated by surface states, which makes it problematic to shell them properly. Even if one could form a conventional shell on a core nanocrystal having a diameter less than 2.0 nm, the potential barrier would likely be abrupt, causing unwanted Auger recombination and impacting the flux stability. Auger recombination is enhanced in this situation since abrupt barriers result in the linear momentum no longer being conserved (since the barriers can provide the extra momentum required for efficient Auger recombination to occur).

The subject invention provides a nanocrystal that combines a center region (with enhanced confinement compared to conventional nanocrystals) with an outer confinement layer, such that both are grown during the same process (and at analogous temperatures), resulting in an overall defect free nanocrystal. Note that due to the need to prevent the onset of Auger recombination, the potential barrier at the interface between the center region and the outer confinement layer cannot be abrupt, which will result in some spreading of the electron and hole wavefunctions into the outer confinement layer. Typical potential barriers for conventional nanocrystals are, for example, 300 meV at the interface, which would cause unwanted Auger recombination.

Given the above requirements, the inventive tight confinement nanocrystal 200 is schematically illustrated in FIG. 1A. The nanocrystal is comprised of two sections, (a) a central homogeneous region 205, which has a first composition, and (b) a smoothly varying region 210, which has a second composition, encompasses the homogeneous region and extends from the surface of the homogeneous region 205 to the outer surface of the tight confinement nanocrystal 200. As discussed above, for the case of typical CdSe- and InP-based nanocrystals, the diameter of the homogeneous region 205 is less than 2.0 nm, with a preferred range of 0.5 to 1.5 nm. Thus, for the case of typical CdSe- and InP-based nanocrystals, the electrons and holes are confined to a smaller volume than that for conventional nanocrystals.

For the case of an arbitrary semiconductor material with a Bohr radius of $B_r$, the diameter of the homogeneous region 205 is less than about 0.2 $B_r$, with a preferred range of about 0.05-0.15 $B_r$. With respect to the smoothly varying region 210, its confining potential barrier monotonically increases to its maximum closer to the surface of the homogeneous region 205 than to the surface of the tight confinement nanocrystal 200 and then monotonically decreases as it extends to the outer surface of the tight confinement nanocrystal 200. As discussed below, the nanocrystal may further be shelled by methods well known in the art.

Figure 1B:
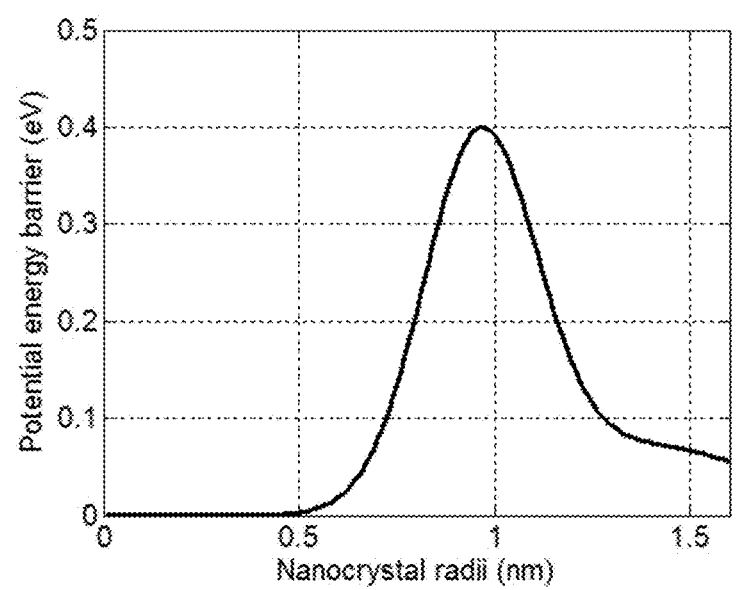
FIG. 1B is a plot showing a representative potential barrier energy profile for a smoothly varying region of the nanocrystal shown in FIG. 1A. The region where the potential barrier value is zero corresponds to the homogeneous region.

FIG. 1B shows a schematic of how the potential barrier might vary for the smoothly varying region 210. The functional form of the potential barrier is not limited to the curve-shape (which is a sum of Gaussians) shown in FIG. 1B. With regard to the maximum in the potential barrier, it is desired to be (for the case of typical CdSe- and InP-based nanocrystals) within ~0.6 nm, and preferably within 0.4 nm, of the surface of the homogeneous region 205. For the illustrative case of FIG. 1B, the barrier maximum is about 0.45 nm from the surface of the homogeneous region 205.

For the case of an arbitrary semiconductor material, the maximum in the potential barrier should be approximately within 0.06 $B_r$, and preferably within about 0.04 $B_r$, of the surface of the homogeneous region 205. In general, the potential barrier should increase monotonically from the surface of the homogeneous region 205 to its maximum, preferably closer to the surface of the homogeneous region than to the surface of the tight confinement nanocrystal, and then decrease monotonically as it reaches the surface of the tight confinement nanocrystal 200. Preferably, the potential barrier of the smoothly varying region does not have any discontinuities in its radial profile. The thickness of the smoothly varying region 210 needs to be sufficient to accommodate the barrier and its fall-off to the outer shell region. However, if the fall-off region is too wide, then the electrons and holes can get trapped in it, thus spoiling the higher confinement.

Accordingly, for the case of typical CdSe- and InP-based nanocrystals, the thickness of the smoothly varying region 210 should be in the range of about 0.5 to 3 nm, with a preferred range of about 0.75 to 2.0 nm. For the case of an arbitrary semiconductor material, the thickness of the smoothly varying region 210 should be in the range of about 0.05-0.3 $B_r$, with a preferred range of about 0.075-0.2 $B_r$. As is well-known in the art, there are two potential barriers, one for electrons and one for holes. Both of these potential barriers should be Type I (i.e., confine the homogeneous region) with respect to the homogeneous region 205. However, the electron and hole potential barriers can be (and typically are) of different magnitudes. Currently, it is easiest to form these barriers (for the electrons and holes), such that, the overall functional forms are analogous (though different in magnitude). However, different functional forms for the electron and hole potential barriers would also result in the desired physical properties (high temperature stability, highly weakened Auger response, and no thermal broadening), and thus are possible inventive nanocrystal compositional profiles.

Using the smoothly varying region 210 to confine the homogeneous region 205 is advantageous since it enables the confinement layers to be grown with the homogeneous region 205 at approximately the same temperature and in the same synthesis reaction, while reducing the defects associated with traditional shelling by employing a potential barrier that monotonically increases from the surface of the homogeneous region to a maximum and then monotonically decreases as it extends to the surface of the tight confinement nanocrystal. As can be seen from FIG. 1B, there are additional unique features associated with the profile. In typical Type I nanocrystals, the center region of the nanocrystal has the smallest bandgap (when in bulk material), while the energy gaps of the surrounding materials are larger and are either constant or increase as they approach the surface of the nanocrystal. As shown in FIG. 1B for the tight confinement nanocrystal 200, the energy gap is smallest in the center region, the confining barrier is relatively thin (its full width at half maximum, FWHM, is about 0.37 nm in FIG. 1B), and it is followed by a second region with a reduced energy gap (though higher than that of the center region). As will be discussed below, surrounding the tight confinement nanocrystals 200 are larger bandgap shell materials. The reason for employing a thin barrier rather than a thick one is to avoid a sharp potential barrier change which would result in unwanted enhancement of Auger recombination. The thin, but high, potential barrier enables enhanced confinement of the electrons and holes to the homogeneous region 205, but enables some quantum mechanical tunneling (of the electrons and holes) between the two regions separated by it. As a result, it avoids the sharp change in the potential barrier and, as will be shown below, enables a large weakening of the Auger response for the inventive nanocrystals. Preferably, the potential barrier of the smoothly varying region does not have any discontinuities in its radial profile. In summary, the profile of FIG. 1B enables enhanced confinement of the electrons and holes to the homogeneous region 205, while simultaneously weakening the Auger response. These properties also result in the electrons and holes substantially being kept away from the overall nanocrystal outer surface. All of these combined features lead to the inventive nanocrystals having excellent thermal stability, a highly reduced Auger response, and no thermal broadening.

Choosing the illustrative case of InGaP-based tight confinement nanocrystals 200, the homogeneous region 205 consists of a first composition of InP, while the smoothly varying region 210 consists of a second composition of InGaP. The radial Ga mole fraction monotonically increases to its maximum closer to the surface of the InP than to the surface of the tight confinement nanocrystal 200, and then monotonically decreases as it reaches the InGaP outer surface. Taking the example of the smoothly varying region 210 consisting of InGaP, the radial Ga mole fraction can vary as shown schematically in FIG. 2. However, other functional dependencies for the radial Ga mole fraction variation are possible. For ternary compounds, the variation in radial mole fraction can occur in either the anion or cation sublattice.

The potential barrier can be derived from the varying radial mole fraction by means well known in the art. Taking the example of an InGaP smoothly varying region, the InGaP energy gap is given by $E_{InGaP}=(1-Ga_m)*1.353+Ga_m*2.777-Ga_m*(1-Ga_m)*0.65$, where $Ga_m$ is the radially varying Ga mole fraction and 0.65 is the InGaP bowing constant. If the homogeneous region consists of InP, then the overall potential barrier (electron plus hole) is $E_{InGaP}-1.353$. Finally, taking the band-offset ratio as 70:30 (conduction to valence), the electron potential barrier is $0.7*(E_{InGaP}-1.353)$ and the hole potential barrier is $0.3*(E_{InGaP}-1.353)$. As is well-known in the art, InGaP becomes indirect at $Ga_m=0.7$, hence, the actual electron potential barrier becomes less straightforward to calculate for $Ga_m>0.7$. Using the above formulation, the resulting radially-varying potential barrier is similar in form to that of the radially-varying element (Ga) mole fraction. As is well known, the radially varying In mole fraction can be directly determined from the corresponding Ga values since the sum of the two needs to equal 1.0 for all positions in the smoothly varying region.

It is important to note that the radial mole fraction of the varying element(s) in the smoothly varying region need not begin at 0% at the surface of the homogeneous region. The varying element(s) could be present in the homogeneous region. In such a case, in the smoothly varying region, the varying element(s) would increase monotonically from the mole fraction in the homogeneous region, preferably reach its/their maximum(s) closer to the homogeneous region than the surface of the tight confinement nanocrystal, and then monotonically decrease(s) as it/they reach(es) the surface of the tight confinement nanocrystal.

Figure 2:
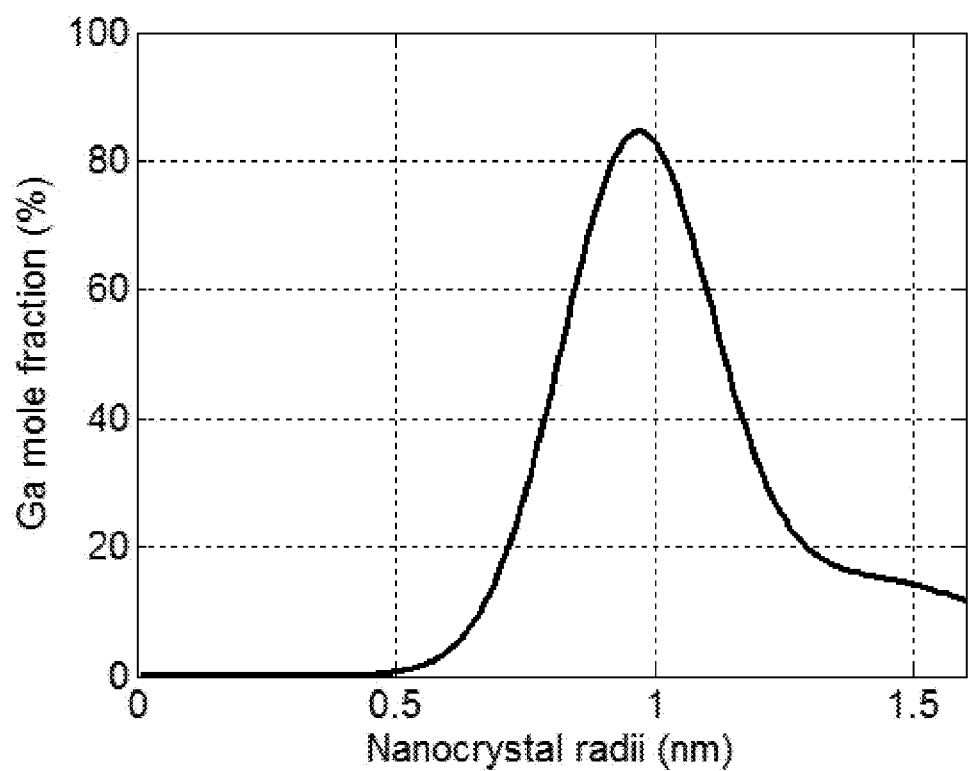
FIG. 2 shows a schematic of a radial mole fraction of a varying element within the smoothly varying region of the nanocrystal shown in FIG. 1. The region where the radial more fraction is zero corresponds to the homogeneous region.

For example, where the homogeneous region consists of InGaP with a Ga mole fraction of 20%, in the smoothly varying region the radial Ga mole fraction increases monotonically from ~20% to its maximum and then monotonically decreases as it reaches the surface of the tight confinement nanocrystal. A peak of less than 100% (roughly 85%) for the radial Ga mole fraction is illustrated in FIG. 2. Also in FIG. 2, the radial Ga mole fraction is approximately 15% at the surface of the nanocrystal. Overall, the radial mole fractions can vary from 0 to 100% (at the barrier maximum) and back down to 0% (at the surface of the tight confinement nanocrystal). However, it is preferred that the radial mole fraction of the varying element(s) be greater than 0% at the surface of the tight confinement nanocrystal in order to avoid trapping of the carriers in the outer zone of the smoothly varying region.

The homogeneous region 205 can consist of any homogeneous single-component, binary or ternary semiconductor material. Illustrative semiconducting materials are type IV, II-VI, III-V, or IV-VI compounds. Representative single-component materials are Si and Ge, representative binary materials are CdSe, CdS, CdTe, ZnTe, InP, InSb, InAs, GaAs, GaSb, PbSe, PbS, and PbTe, while representative ternary materials are CdSeS, InAsP, InSbP, and PbSeS. Other single-component, binary or ternary combinations are possible, as is well-known in the art.

For the smoothly varying region 210, any binary, ternary, or quaternary semiconductor material can be used provided that the smoothly varying region confines the electrons and holes in the homogeneous region. Illustrative semiconducting materials are type II-VI, III-V, or IV-VI compounds, however, as is well-known in the art, other semiconducting systems are possible. Variations in the elemental mole fractions can either be on the anion or cation sublattice. To minimize defects, it is preferred that the same semiconductor group be used for the homogeneous and smoothly varying regions. For the case that the homogeneous region 205 consists of single-component semiconductor material, the smoothly varying region 210 preferably consists of binary, ternary or quaternary semiconductor material. For the case that the homogeneous region 205 consists of binary semiconductor material, the smoothly varying region 210 preferably consists of ternary or quaternary semiconductor material. Correspondingly, for the case that the homogeneous region 205 consists of ternary semiconductor material, the smoothly varying region 210 preferably consists of quaternary semiconductor material.

In a smoothly varying binary or ternary semiconductor region, one element monotonically increases its radial elemental contents to reach its maximum, preferably closer to the surface of the homogeneous region than to the surface of the tight confinement nanocrystal, and then monotonically decrease as it reaches the surface of the tight confinement nanocrystal. It should be noted, taking the example of an InGaP ternary material, that as the Ga content ($C_{Ga}$) varies as described above, the In content ($C_{In}$) variation is related by way of $C_{In}=1-C_{Ga}$. If the smoothly varying region is a quaternary semiconductor, one or two elements may monotonically increase its/their radial elemental content(s) to reach its/their maximum(s), preferably closer to the surface of the homogeneous region than to the surface of the tight confinement nanocrystal, and then monotonically decrease as it/they reach the surface of the tight confinement nanocrystal.

As for the above example of the InGaP ternary material, the other element in the sublattice varies such that the overall anion or cation mole fractions sum to 1.0. Representative quaternary materials are ZnMgSeSe, CdZnSeS, and InAlAsP. Other quaternary combinations are possible, as is well known in the art. It is preferable, though not required, that the tight confinement nanocrystal 200 consists of semiconductors from the same family (IV, III-V, II-VI, or IV-VI) in order to reduce defect formation. For example, both the homogeneous region 205 and the smoothly varying region 210 may consist of III-V semiconductor material.

Possible lattice structures of the tight confinement nanocrystal and its optional shell(s) are well-known in the art and, for example, may include zincblende, wurtzite, or rocksalt structures. As is well known in the art, the optional shell structure and the tight confinement nanocrystal 200 typically have the same lattice structure; however, the inventive nanocrystals also include the case where the two lattice structures are different.

While shelling is not required, the quantum efficiency and environmental stability of the tight confinement nanocrystals 200 can be increased by shelling them with at least one layer comprised of a material having a third composition. As is well known in the art, the shell material typically has a wider bandgap than that of the materials comprising the tight confinement nanocrystal. Either a single shell or multiple shells can be used. For example, the number of shells may range from 0 to 100, including each integer in between. As is well-known in the art, the shell(s) can comprise any wider bandgap semiconductor(s) that result in additional confinement of the tight confinement nanocrystal 200. Particular examples are type IV, II-VI, III-V, or IV-VI semiconductors, or combinations thereof.

Appropriate shelling can be illustrated by the following example. The homogeneous region 205 consists of CdSe, while the smoothly varying region 210 consists of CdZnSe, with the radial Zn mole fraction being highest near the surface of the homogeneous region 205. Some appropriate wider bandgap semiconductor materials for shelling the example Cd-based tight confinement nanocrystal 200 are ZnSe, ZnS, ZnSeS, ZnMgSe, ZnMgS, and ZnMgSeS. It is preferable that the shelling materials be chosen to minimize the lattice constant variation throughout the nanocrystal volume, while enhancing the electron and hole confinement. Given these principles, for the above example of Cd-based tight confinement nanocrystals 200, one particular shell combination is ZnSe, followed by ZnSeS and then ZnS.

In general, the thickness and type of each shell layer is varied in order to enhance the quantum efficiency and temperature stability of the overall nanocrystals. In one embodiment, each shell layer can have a uniform composition. However, to reduce the amount of Auger recombination, when an intermediate shell contains elements that are absent from its adjacent shells, it is preferred to increase/decrease the radial mole fraction of these elements monotonically from the inner surface of the intermediate shell to its outer surface. Thus in the above shell combination of ZnSe, followed by ZnSeS and then ZnS, preferably, ZnSeS is not a homogeneous layer. Instead, the radial sulfur mole fraction rises monotonically from ~0% adjacent to the ZnSe shell to greater than 75% at the outer surface of the ZnSeS shell. Each shell can have a thickness from 1 to 100 monolayers.

In another example, the homogeneous region 205 consists of InP, while the smoothly varying region 210 consists of InGaP. This structure is typically shelled with either wider bandgap III-V or II-VI materials, with the latter being the more common choice. Going this route, one particular shell combination is again ZnSe, followed by ZnSeS and then ZnS. Again, preferably, the radial sulfur mole fraction rises monotonically from 0% adjacent to the ZnSe shell to greater than 75% at the outer surface of the ZnSeS shell.

A number of procedures can be applied for creating the tight confinement nanocrystal 200. Shelling of the nanocrystals follows standard processes in the art. A particularly advantageous example of the manufacturing process follows.

In accordance with an aspect of the present invention, it is typical that the cation precursor used for synthesizing the tight confinement nanocrystal 200 is a group IIb, IIIa, or IVa material. Some examples of group IIb cation precursors are $Cd(Me)_2$, CdO, $CdCO_3$, $Cd(Ac)_2$, $CdCl_2$, $Cd(NO_3)_2$, $CdSO_4$, ZnO, $ZnCO_3$, $Zn(Ac)_2$, $Zn(Et)_2$, $Hg_2O$, $HgCO_3$ and $Hg(Ac)_2$. Some examples of group IIIa cation precursors are $In(Ac)_3$, $InCl_3$, $In(acac)_3$, $In(Me)_3$, $In_2O_3$, $Ga(acac)_3$, $GaCl_3$, $Ga(Et)_3$, and $Ga(Me)_3$. Other appropriate cation precursors well known in the art can also be used.

It is typical that the anion precursor used for the synthesis of the tight confinement nanocrystal 200 is a material selected from a group consisting of S, Se, Te, N, P, As, and Sb (when the semiconducting material is a II-VI, III-V, or IV-VI compound). Some examples of corresponding anion precursors are bis(trimethylsilyl)sulfide, tri-n-alkylphosphine sulfide, hydrogen sulfide, tri-n-alkenylphosphine sulfide, alkylamino sulfide, alkenylamino sulfide, tri-n-alkylphosphine selenide, alkenylamino selenide, tri-n-alkylamino selenide, tri-n-alkenylphosphine selenide, tri-n-alkylphosphine telluride, alkenylamino telluride, tri-n-alkylamino telluride, tri-n-alkenylphosphine telluride, tris(trimethylsilyl)phosphine, triethylphosphite, sodium phosphide, potassium phosphide, trimethylphosphine, tris(dimethylamino)phosphine, tricyclopentylphosphine, tricyclohexylphosphine, triallylphosphine, di-2-norbornylphosphine, dicyclopentylphosphine, dicyclohexylphosphine, dibutylphosphine, tris(trimethylsilyl)arsenide, bis(trimethylsilyl)arsenide, sodium arsenide, and potassium arsenide. Other appropriate anion precursors known in the art can also be used. When the tight confinement nanocrystal at least partially comprises a group IV element, typical semiconductors are Si and Ge.

A wealth of suitable high boiling point compounds exist that can be used both as reaction media (coordinating solvents) and, more importantly, as coordination (growth) ligands to stabilize the metal ion after it is formed from its precursor at high temperatures. They also aid in controlling particle growth and impart colloidal properties to the nanocrystals. Among the different types of coordination ligands that can be used, some common ones are alkyl phosphine, alkyl phosphine oxide, alkyl phosphate, alkyl amine, alkyl phosphonic acid, and fatty acids. The alkyl chain of the coordination ligand is typically a hydrocarbon chain of length greater than 4 carbon atoms and less than 30 carbon atoms, which can be saturated, unsaturated, or oligomeric in nature. It can also have aromatic groups in its structure.

Specific examples of suitable coordination (growth) ligands and ligand mixtures include, but are not limited to, trioctylphosphine, tributylphosphine, tri(dodecyl)phosphine, trioctylphosphine oxide, tributylphosphate, trioctyldecyl phosphate, trilauryl phosphate, tris(tridecyl)phosphate, triisodecyl phosphate, bis(2-ethylhexyl)phosphate, tris(tridecyl)phosphate, hexadecylamine, oleylamine, octadecylamine, bis(2-ethylhexyl)amine, octylamine, dioctylamine, cyclododecylamine, n,n-dimethyltetradecylamine, n,n-dimethyldodecylamine, phenylphosphonic acid, hexyl phosphonic acid, tetradecyl phosphonic acid, octylphosphonic acid, octadecyl phosphonic acid, propylphosphonic acid, aminohexyl phosphonic acid, oleic acid, stearic acid, myristic acid, palmitic acid, lauric acid, and decanoic acid. Further, they can be used by diluting the coordinating ligand with at least one solvent selected from a group consisting of, for example, 1-nonadecene, 1-octadecene, cis-2-methyl-7-octadecene, 1-heptadecene, 1-pentadecene, 1-tetradecenedioctylether, dodecyl ether, and hexadecyl ether, or the like.

In some embodiments to form nanocrystals comprising III-V materials, the growth ligands include column II metals, including Zn, Cd or Mg. In some advantageous embodiments, the zinc compound is zinc carboxylate having the formula:

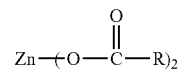

where R is a hydrocarbon chain of length equal to or greater than 1 carbon atom and less than 30 carbon atoms, which are saturated, unsaturated, or oligomeric in nature. It can also have aromatic groups in its structure. Specific examples of suitable zinc compounds include, but are not limited to, zinc acetate, zinc undecylenate, zinc stearate, zinc myristate, zinc laurate, zinc oleate, zinc palmitate, or combinations thereof.

Examples of non-coordinating or weakly coordinating solvents include higher homologues of both saturated and unsaturated hydrocarbons. Mixture of two or more solvents can also be used. In some embodiments, the solvent is selected from unsaturated high boiling point hydrocarbons, $CH_3(CH_2)_nCH=CH_2$ wherein n=7-30, such as, 1-nonadecene, 1-octadecene, 1-heptadecene, 1-pentadecene, or 1-eicosene, where the specific solvent used is based on the reaction temperature of the nanocrystal synthesis.

The solvents used in accordance with the present invention may be coordinating or non-coordinating, a list of possible candidates being given above. It is preferred that the solvent have a boiling point above that of the growth temperature; as such, prototypical coordinating and non-coordinating solvents are trioctylphosphine and octadecene, respectively. However, in some cases, lower boiling solvents are used as carriers for the precursors; for example, tris(trimethylsilyl) phosphine can be mixed with hexane in order to enable accurate injections of small amounts of the precursor.

Embodiment 1

Synthesis of the Homogeneous Region

In a first step, a homogeneous region 205 consisting of single-component, binary or ternary semiconductor material is synthesized. A typical synthetic route is decomposition of molecular precursors at high temperatures in coordinating solvents [C. B. Murray et al., Annu. Rev. Mater. Sci, 30, 545 (2000)]. When forming homogeneous ternary compounds on the cation sublattice, for example, it is preferred that the two cation precursors have matched reactivities in order to ensure that the resulting center region is homogeneous in semiconductor content. Analogous comments pertain to forming ternary compounds on the anion sublattice. The single-component, binary or ternary homogeneous region 205 preferably comprises type IV, II-VI, III-V, or IV-VI semiconducting materials or combinations thereof. Since the sizes of the homogeneous region 205 are small, it is helpful when the growth rates of the nanocrystals are constrained in order to enable nanocrystals of these sizes. For example, the growth rate for typical CdSe nanocrystals is very high, however, adding tetradecylphosphonic acid (TDPA) to the growth ligands significantly reduces the CdSe growth rate while enabling the formation of high quality nanocrystals.

In accordance with one aspect of the present invention, a growth process for forming the homogeneous region 205 involves: 1) Adding into a flask a first solution comprised of a solvent, either coordinating (reacts or forms bonds with the precursors or with the nanocrystal surface) or non-coordinating (does not react or form bonds with precursors or with the nanocrystal surface), optionally, some growth ligands, and optionally, at most one nanocrystal precursor (in a further aspect, the precursors may be only added in step 3); 2) Heating the flask to the nanocrystal nucleation temperature, while vigorously stirring its contents; 3) Adding to a first syringe, a second solution containing a solvent, at least one additional and different precursor than that in the first solution, and optionally, some growth ligands; and 4) Swiftly (within ~0.25 s) injecting the contents of the syringe into the heated flask to form a crude solution of nanocrystals having a homogeneous region 205. The growth rate of the homogeneous region 205 determines the time delay between the step 4 injection and the injection of the additional precursors that enable the formation of the smoothly varying region 210. This time delay can typically vary from about 0.25 s to 5 s, depending on the growth rate, with times of about 0.5 s for fast reacting compounds, such as trimethylindium, and tris(trimethylsilyl) phosphine (to form InP). The homogeneous region 205 is allowed to grow for the appropriate time to reach the appropriate diameter. Preferably, the above process is performed under airless conditions involving conventional gloveboxes and Schlenk lines. In order to obtain materials of the highest quality, the growth temperatures for nanocrystals comprising II-VI and III-V materials are typically between 250 and 320° C. The solvents used in the first or second syringe can be coordinating or non-coordinating, a list of possible candidates being given above. It is preferred that the solvent have a boiling point above that of the growth temperature; however, in some cases, lower boiling solvents are used as carriers for the precursors, such as, hexane or heptane. The list of possible growth ligands has been discussed above. Candidate anion and cation precursors have also been discussed above.

Synthesis of Smoothly Varying Region

Following the formation of the homogeneous region 205, the formation of the smoothly, varying region 210 requires the filling of a second syringe with a third solution containing a solvent, some (or none) growth ligands, and additional precursor(s). As stated above, the time delay between injecting the first and second syringes is typically 0.25 s to 5 s. As for the addition of the first syringe, the contents of the second syringe is swiftly injected into the heated flask. Following its injection, the growth temperature is lowered (typically 10° C. to 70° C. below that of the nucleation growth temperature) and the smoothly varying region 210 is allowed to grow for the appropriate time (from about 1 to 60 minutes).

Examples of common solvents and growth ligands for the third solution have been discussed above in reference to those for the second solution. The list of possible additional precursor(s) is also the same as that given above for forming the homogeneous region 205. To form a binary, ternary or quaternary compound, the additional precursors can either be cations or anions. In order to properly grow the smoothly varying region 210, it is preferred that the injected precursor(s) (for example, the cation precursor for the pair of InP and InGaP) from the second syringe has/have a reactivity that is faster than that of the corresponding (precursor(s) from the first syringe. More particularly, taking the example of an InP-based homogeneous region 205 formed from trimethylindium and tris(trimethylsilyl)phosphine, for a smoothly varying region 210 consisting of InGaP, the Ga precursor should have a reactivity in the growth solution that exceeds that of trimethylindium; triethylgallium is an appropriate example. Given the differences in reactivity, once the triethylgallium is injected, InGaP, with larger mole fractions of Ga, is preferentially formed, leading to the rapid buildup to the maximum of the InGaP potential barrier (as illustrated in FIG. 1B). As the concentration of the Ga precursor drops, its overall reactivity will fall (by mass action considerations), leading to the monotonic decrease of the InGaP potential barrier (also as illustrated in FIG. 1B).

Continuing with the InGaP example, in order to preferentially form InGaP with a high Ga mole fraction at the maximum, the reactivity of the chosen Ga precursor with the P precursor should preferably be at least twice as large as that of the corresponding In precursor. Choosing appropriate Ga precursors having specific reactivity values (relative to that of the In precursor) can be done using methods that are well known in the art. Though these remarks are made with reference to the InP—InGaP system, they apply as well to other single component-binary, single component-ternary, single component-quarternary, binary-ternary, binary-quaternary, and ternary-quaternary combinations (and to the corresponding precursors) for the homogeneous 205 and smoothly varying regions 210.

As will be discussed in the section below, in some instances the injected precursors can react rapidly with the growth ligands to form new compounds, such as, Ga and In myristate. In this case, the above comments with regard to reactivity differences applies to these newly formed Ga and In compounds.

Embodiment 2

Synthesis of the Homogeneous and Smoothly Varying Regions

As discussed above with regard to Embodiment 1, a typical synthetic route is decomposition of molecular precursors at high temperatures in coordinating solvents [C. B. Murray et al., Annu Rev. Mater. Sci. 30, 545 (2000)]. Preferably, the synthesis is performed under airless conditions involving conventional gloveboxes and Schlenk lines. Other processes have been employed to form nanocrystals, such as, solvothermal methods, however, they do not lend themselves to creating the smoothly varying region 210. When forming homogeneous ternary compounds on the cation sublattice, for example, it is preferred that the two cation precursors have matched reactivities in order to ensure that the resulting homogeneous region is uniform in semiconductor content. Analogous comments pertain to forming ternary compounds on the anion sublattice.

The single-component, binary or ternary homogeneous region 205 typically comprises type IV, II-VI, III-V, or IV-VI semiconducting materials or a combination thereof, while the binary, ternary, or quaternary smoothly varying region 210 typically comprises type IV, II-VI, III-V, or IV-VI semiconducting materials or a combination thereof. Since the sizes of the homogeneous region 205 can be small, it is helpful when the growth rates of the nanocrystals are constrained in order to enable nanocrystals of these sizes. For example, the growth rate for typical CdSe nanocrystals is very high, however, adding TDPA to the growth ligands significantly reduces the CdSe growth rate, while enabling the formation of high quality nanocrystals.

In accordance with a further aspect of the present invention, a method of producing nanocrystals employs a single injection of all of the precursors that are responsible for the varying potential profile. This injection may be made by way of a single syringe containing all of the reactants, or may include two or more syringes, each containing different reactants. Again, taking the example of an InP homogeneous region 205 and an InGaP smoothly varying region 210, the syringe(s) would contain both the In and Ga precursors. As is well known in the art, the P precursor can either be included in a syringe or may be present in the reaction flask prior to the injections. In order for this methodology to work properly, the In (second precursor) and Ga (third precursor) precursors need to be chosen such that the P precursor (first precursor) reacts preferentially with the In precursor for the initial stages (typically seconds) of the reaction, then the reactivities quickly change such that the Ga precursor is more reactive. A set of precursors that fulfills these requirements is trimethylindium (TMIn) and triethylgallium (TEGa) for the In and Ga precursors, respectively. As used within the following discussion, the acronyms TM shall designate trimethyl; TE shall designate triethyl; DM shall designate dimethyl; DE shall designate diethyl; MDE shall designate methyldiethyl and DME shall designate dimethylethyl.

As is well known in the art, when TMIn and TEGa are placed in the same syringe at room temperature, they rapidly undergo metal-alkyl ligand exchange to form a collection of methylethyl-metal (In, Ga) compounds [M. Kappers et al., J. Cryst. Growth 191, 332 (1998)]. Since the methyl-containing compounds are slower reacting, the exchange causes the In precursor to be become more reactive and the Ga precursor to become less reactive. More specifically (M. Kappers, ibid), it has been found that after exchange the TEGa exchanges to MDEGa, DMEGa, and TMGa, while the TMIn exchanges to MDEIn and DMEIn, with approximate decomposition temperatures of 325° C., 450° C., 550° C., 280° C., and 320° C., respectively.

Accordingly, upon initial injection into the hot reaction vessel, the P precursor preferentially reacts with the In metal alkyl precursors to form InP. After being in the hot solution for, at most, a few seconds (for example, 1 s to 3 s), the metal alkyl compounds react to form compounds with the growth ligands, for example, Ga-myristate when myristic acid (MA) is used as a growth ligand. For example, in the presence of MA, In-acetate will react to form In-myristate at temperatures as low as 150° C. [D. Battaglia et al., Nano Lett. 2, 1027 (2002)].

With regard to the reactivity of In- and Ga-myristate compounds, it is well known that the reactivity of organometallics decreases for column III element-containing compounds as one proceeds from boron-down to thallium-containing compounds [N. Greenwood et al., Chemistry of the Elements, Elsevier, 2005)]. The difference in reactivity is also evident from the decreasing electrophilic index of the column III elements [R. Parr et al., J. Amer. Chem. Soc. 121, 1922 (1999)]. As a result of the difference in reactivity, once the In- and Ga-ligand compounds are formed (for example, In- and Ga-myristate which are the second precursor-ligand compound and third precursor-ligand compound, respectively), the P precursor will preferentially react with the Ga compounds, leading to the rapid buildup to the maximum of the InGaP potential barrier (as illustrated in FIG. 1B). As the concentration of the Ga precursor drops, the overall Ga reactivity will fall (by mass action considerations), leading to the fall-off of the InGaP potential barrier (also as illustrated in FIG. 1B). Note that in FIG. 2 for the case of an InGaP smoothly varying region 210, that the Ga content can be in excess of 68% where the alloy becomes indirect [J. Nicklas et al., Appl. Phys. Lett. 97, 091902 (2010)]. The impact of this direct-indirect transition will be to limit the height of the InGaP-based potential barrier. Though these remarks are made with reference to the InP—InGaP system, they apply as well to other single component-binary, single component-ternary, single component-quarternary, binary-ternary, binary-quaternary, and ternary-quaternary combinations (and to the corresponding precursors) for the homogeneous 205 and smoothly varying regions 210.

In the above discussion, TEGa and TMIn are good precursor choices since after ligand exchange, the average In metal alkyl decomposition temperature is about 300° C., while that of the Ga metal alkyls is about 440° C., resulting in greatly reduced GaP formation. In general, a difference in decomposition temperature of about 50° C. to 100° C. should be sufficient for the injected precursor compounds. With regard to the difference in reactivity of the precursor compounds once they form metal-ligand compounds (e.g., In- and Ga-myristate), it is preferred that the reactivity difference of the compounds be at least a factor of 2, i.e., the Ga-ligand compound being at least 2 times more reactive than the In-ligand compound, in order to obtain the rapid rise in the Ga content of the smoothly varying region. Choosing appropriate Ga-ligand compounds having specific reactivity values (relative to that of the In-ligand compounds) can be done using methods that are well known in the art.

From our own experience, we have seen that for column VI elements, the reactivity of compounds increases going down the column, i.e., from S to Se to Te. For column IV elements, it is reported that the reactivity of the compounds decreases going down the column, i.e., from Si to Ge to Sn [D. Harris et al., JACS 134, 20211 (2012).

Though examples were given using TMIn and TEGa, another suitable combination would be TEIn and TMAl (trimethylaluminum), with the corresponding decomposition temperatures being <250° C. and >350° C., respectively. In this case, the TEIn and TMAl are injected simultaneously but are placed in separate syringes to prevent ligand exchange prior to injection. Once the In- and Al-ligand compounds form, the Al-ligand compound would have a significantly faster reactivity than the In-ligand compound resulting in the desired rapid growth of the InAlP potential barrier height.

The column II metal alkyl compounds are also well known to undergo rapid ligand exchange [M. Kappers et al., J. Phys. Chem. B101 4882 (1997)]. Accordingly, for the case of a CdSe homogeneous region 205 and a CdZnSe smoothly varying region 210, a possible combination is DMCd and DEZn, which ligand exchanges to form DMZn, MEZn, MECd, and DECd, with the Cd metal alkyls decomposing at least 100° C. lower than the Zn metal alkyls. Once the Cd- and Zn-ligand compounds form, the reactivity of column II organometallics scales according to the ionicity of the carbon-metal bond, resulting in the reactivity going from highest to lowest for Mg, Zn, Cd, and Hg containing compounds, respectively. Accordingly, the Zn-ligand compounds would be more reactive than the Cd compounds resulting in the desired rapid rise in the CdZnSe potential barrier height. Though the above examples were given as possible precursor combinations, as is well known in the art, many other suitable combinations exist and are included as part of this invention.

In the above examples, the smoothly varying region 210 was chosen such that variations in the cation mole fractions led to the variation in the region's potential energy barrier profile. As is well-known in the art, the variation of mole fractions can also occur on the anion sub-lattice, such as, ZnSeS.

In accordance with the above recitation, the growth method for producing a solution of the tight confinement nanocrystals 200 includes the steps of: 1) adding into a flask a first solution comprised of a solvent (either coordinating or non-coordinating), some (or none) growth ligands, and optionally, at most two nanocrystal precursors (for a ternary homogeneous region 205) (in a further aspect, the precursors may be added in step 3); 2) heating the flask to the nanocrystal nucleation temperature, while stirring its contents; 3) adding to a first syringe, a second solution containing a solvent, at least one precursor (if precursors were initially added in the starting flask, the at least one precursor would be an additional and different precursor than that in the first solution), and optionally some additional growth ligands; 4) swiftly injecting the contents of the syringe into the heated flask to form the homogeneous region 205 and at most an initial part of the binary, ternary or quaternary smoothly varying region 210; and 5) lowering the flask temperature by about 10° C. to 70° C. to complete the growth (typically from 5 to 60 minutes) of the binary, ternary or quaternary smoothly varying region 210.

As is well known in the art, the overall growth time for the tight confinement nanocrystals 200 can be adjusted in order to obtain nanocrystals having different emission wavelengths. In accordance with an aspect of the present invention, this process is typically performed under airless conditions involving conventional gloveboxes and Schlenk lines. In a further aspect, if there are two precursors in the reaction flask in step 1, then they both need to be cations or anions. Still further, a second syringe may be filled with a third solution and comprised of a (non-coordinating) solvent and injected quickly prior to step 5 in order to help lower the flask temperature more quickly. It is preferred that this second syringe is injected within 0.1 s to 5 s of injecting the first syringe; however, since this second syringe only contains a (non-coordinating) solvent, its timing relative to the first syringe injection is not crucial. Additionally, in a further aspect the contents of the second syringe can be added to syringe one thereby resulting in only one rapidly injected syringe. In this case, the extra room temperature liquid in the first syringe aids in lowering the flask temperature from the nucleation temperature to the growth temperature.

In order to obtain materials of the highest quality, the nucleation and growth temperatures for nanocrystals comprising column II-VI and III-V materials are typically between 270° C. and 330° C. and 240° C. and 300° C., respectively. In a further aspect of the present invention, the contents of the first syringe can be distributed amongst more than one syringe where the multiple syringes are injected substantially simultaneously. This separation into multiple syringes is helpful when one is trying to avoid reactions between the various components of the second solution. For example, taking the case of an InGaP-based tight confinement nanocrystal, possible metal alkyl choices can be trimethylgallium and triethylindium, when multiple syringes are employed.

Shelling the Nanocrystal

Following the formation of the smoothly varying region 210, for example, in accordance with either Embodiment 1 or Embodiment 2 discussed above, single or multiple shells can optionally be added onto the tight confinement nanocrystal 200 by well-known procedures in the art. The shelling can be accomplished via the decomposition of molecular precursors at high temperatures in coordinating solvents [M. A. Hines et al., J. Phys. Chem. 100, 468 (1996)]. Additional discussions of forming semiconducting shells on nanocrystal cores can be found in Masala [O. Masala and R. Seshadri, Annu Rev. Mater. Res. 34, 41 (2004)] and U.S. Pat. No. 6,322,901. Most commonly, the shell(s) can comprise II-VI, III-V, or IV-VI semiconducting materials or a combination thereof. For III-V based core nanocrystals, it is typical to shell with II-VI materials due to their wider bandgaps. However, other confining shells may also be used when the tight confinement nanocrystal 200 comprises of III-V materials.

When shelling with II-VI compounds, the shelling temperatures are typically from 170° C. to 230° C. In order to avoid the formation of nanocrystals composed solely of the shelling material, the shell precursors are either slowly dripped together or the shell precursors are added one-half monolayer at a time (again typically at a slow rate). When using II-VI materials to shell III-V based tight confinement nanocrystals 200, it is also preferred that the surfaces of the nanocrystals be etched in weak acids [E. Ryu et al., Chem. Mater. 21, 573 (2009)] and then annealed at elevated temperatures (from 180° C. to 260° C.) prior to shelling. One example of a weak acid is acetic acid. As a result of the acid addition and annealing, the tight confinement nanocrystals 200 tend to aggregate. It is, therefore, desirable that ligands be added to the growth solution prior to the initiation of the shelling procedure. Useful ligands are primary amines, such as, hexadecylamine, or acid-based amines, such as, oleylamine.

Continuing with the example of InP/InGaP based tight confinement nanocrystals 200, it is useful to shell with ZnSe, followed by ZnSeS, followed by ZnS. The various shell thicknesses and the S mole fraction of the middle shell are determined by optimizing the nanocrystals for quantum efficiency, temperature stability, lack of an Auger response, and the absence of PL thermal broadening. As discussed above, the S mole fraction of the middle shell can be varied monotonically from ZnSe to ZnS. As is well-known in the art, it is also beneficial to anneal the nanocrystals near the shelling temperatures following each shelling step for times ranging from 10 to 30 minutes.

EXPERIMENTAL DETAILS

The following examples are presented as further understandings of the present invention and are not to be construed as limitations thereon.

Example I-1

Preparation of the Inventive Shelled Tight Confinement Nanocrystals, InP/InGaP/ZnSe/ZnSeS/ZnS, in Accordance with the Method of Embodiment 1

All synthetic routes were carried out using standard airless procedures with a glovebox and a Schlenk line. In one growth step both the homogeneous region 205, consisting of InP, and the smoothly varying region 210, consisting of InGaP, are formed. 0.12 g myristic acid, 45 mg Zn undecylenate and 9 ml 1-octadecene (ODE) were loaded into a three-neck flask. The mixture was degassed at 100° C. for 1.5 hours. After switching to $N_2$ overpressure, the flask contents were heated to 300° C., while vigorously stirring its contents. Two precursor solutions were prepared and loaded into corresponding syringes. The first precursor solution contained 13 mg trimethylindium (TMIn), 14.2 µl of tris(trimethylsilyl)phosphine ($P(TMS)_3$), 26.3 µl of oleylamine, 167 µl of hexane, and 2.74 ml ODE; the second precursor solution contained 16 µl of triethylgallium (TEGa), 26.3 µl of oleylamine, 144 µl of hexane, and 2.24 ml of ODE. When the reaction flask reached 300° C., the first syringe was quickly injected into the hot flask to form InP. After a time delay of about 0.5 s, the second syringe was rapidly injected into the hot flask to form the smoothly varying region of InGaP. After the second injection, the flask temperature was lowered to about 270° C. and the nanocrystals were grown for 15 minutes in total. The reaction was stopped by removing the heating source.

The InP/InGaP tight confinement nanocrystals 200 were shelled with wider bandgap II-VI materials. The shelling began with a weak acid etch of the nanocrystals. After the reaction flask was cooled to room temperature under continuous stirring, 200 µl acetic acid was loaded into a syringe and then injected into the flask. This was followed by annealing the contents of the flask for 60 minutes at 220° C. Since the nanocrystals aggregated following this step, the reaction flask was cooled to 190° C. and 0.5 ml of oleylamine was injected into the flask. The contents were then annealed at 190° C. for 10 minutes.

Multiple ZnSeS-based shells were grown on the etched nanocrystals at 190° C. by the following procedure. The precursor solutions containing Zn, Se, and S were prepared in a glovebox prior to growing the shells. The first solution of 563 µl of diethylzinc (DEZ) solution (10% DEZ in hexane) and 1 ml of ODE was added dropwise to the reaction mixture under vigorous stirring; the flask contents were then annealed at 190° C. for 10 minutes to form approximately one-half monolayer of Zn. A second solution of 28 mg of Se powder, 200 µl of tri-n-butylphosphine, and 1.5 ml of ODE was then added dropwise to the reaction mixture under vigorous stirring; the flask contents were then annealed at 190° C. for 10 minutes to form approximately one-half monolayer of Se. To start the second shell, 1.09 ml of DEZ solution and 1 ml of ODE were added dropwise to the reaction mixture under vigorous stirring; the flask contents were then annealed at 190° C. for 10 minutes to form approximately one-half monolayer of Zn. The chalcogen portion of the monolayer was grown by using two programmed syringe pumps to linearly ramp from Se to $Se_{0.25}S_{0.75}$ over about 7 minutes and then maintained at $Se_{0.25}S_{0.75}$ until the SeS syringe empties. The Se-only syringe contained 11 mg of Se, 66 µl of tri-n-butylphosphine, and 0.4 ml of ODE; the SeS syringe contained 8.6 mg of Se, 10.2 mg of S, 157 µl of tri-n-butylphosphine, and 1.2 ml of ODE. Following the drip-in of these precursors, the flask contents were then annealed at 190° C. for 10 minutes. Next, to prevent aggregation of the enlarging nanocrystals, 170 mg of myristic acid dissolved in 1 ml of toluene was slowly dripped in, followed by annealing at 190° C. for 10 minutes. Lastly, a ZnS shell was formed by slowly dripping in 2.15 ml of DEZ solution, 35 mg of S, 200 µl of tri-n-butylphosphine, and 2.0 ml of ODE. This was followed by annealing at 190° C. for 10 minutes.

Relative quantum yield measurements were performed on the nanocrystals by procedures well-known in the art. The comparison fluorescent material was Rhodamine 6G, which has an absolute quantum efficiency of 0.95. The crude nanocrystal solutions were mixed with toluene to make the quantum yield measurements. The resulting nanocrystals of Example I-1 had a relative quantum efficiency of 81% (at room temperature) at an excitation wavelength of 469 nm. The nanocrystals had an emission peak at 559 nm and a spectral FWHM of 69 nm.

Example I-2

Preparation of the Inventive Shelled Tight Confinement Nanocrystals, InP/InGaP/ZnSe/ZnSeS/ZnS, in Accordance with the Method of Embodiment 2

All synthetic routes were carried out using standard airless procedures with a glovebox and a Schlenk line. In one growth step both the homogeneous region 205, consisting of InP, and the smoothly varying region 210, consisting of InGaP, are formed. 0.12 g myristic acid, 45 mg Zn undecylenate and 9 ml ODE were loaded into a three-neck flask. The mixture was degassed at 100° C. for 1.5 hours. After switching to $N_2$ overpressure, the flask contents were heated to 300° C., while vigorously stirring its contents. One precursor solution was prepared and loaded into a single syringe. The precursor solution contained 13 mg trimethylindium, 14.5 µl of triethylgallium, 14.2 µl of tris(trimethylsilyl)phosphine, 52.6 µl of oleylamine, 297 µl of hexane, and 2.47 ml ODE. When the reaction flask reached 300° C., the syringe was quickly injected into the hot flask to begin forming the InP/InGaP-based tight confinement nanocrystals. After a time delay of ~0.5 s, a second syringe containing 2.5 ml of ODE was quickly injected into the hot flask to aid in lowering the flask temperature. After the second injection, the flask temperature was lowered to about 270° C. and the nanocrystals were grown for 15 minutes in total. The reaction was stopped by removing the heating source.

The InP/InGaP tight confinement nanocrystals 200 were shelled with wider bandgap II-VI materials. The shelling began with a weak acid etch of the nanocrystals. After the reaction flask was cooled to room temperature under continuous stirring, 200 µl of acetic acid was loaded into a syringe and then injected into the flask. This was followed by annealing the contents of the flask for 60 minutes at 220° C. Since the nanocrystals aggregated following this step, the reaction flask was cooled to 190° C., 0.5 ml of oleylamine was injected into the flask, and its contents were annealed at 190° C. for 10 minutes.

Multiple ZnSeS-based shells were grown on the etched nanocrystals at 190° C. by the following procedure. The precursor solutions containing Zn, Se, and S were prepared in a glovebox prior to growing the shells. The first solution of 315 µl of diethylzinc solution (1M DEZ in undecane) and 1 ml of ODE was added dropwise to the reaction mixture under vigorous stirring; the flask contents were then annealed at 190° C. for 10 minutes to form approximately one-half monolayer of Zn. A second solution of 28 mg of Se powder, 200 µl of tri-n-butylphosphine, and 1.5 ml of ODE was then added dropwise to the reaction mixture under vigorous stirring; the flask contents were then annealed at 190° C. for 10 minutes to form approximately one-half monolayer of Se. To start the second shell, 610 µl of DEZ solution and 1 ml of ODE were added dropwise to the reaction mixture under vigorous stirring; the flask contents were then annealed at 190° C. for 10 minutes to form approximately one-half monolayer of Zn. The chalcogen part of the monolayer was grown by using two programmed syringe pumps to linearly ramp from Se to $Se_{0.25}S_{0.75}$ over about 7 minutes and then maintained at $Se_{0.25}S_{0.75}$ until the SeS syringe empties. The Se only syringe contained 11 mg of Se, 66 µl of tri-n-butylphosphine, and 0.4 ml of ODE; the SeS syringe contained 8.6 mg of Se, 10.2 mg of S, 157 µl of tri-n-butylphosphine, and 1.2 ml of ODE. Following the drip-in of these precursors, the flask contents were then annealed at 190° C. for 10 minutes. Next, to prevent aggregation of the enlarging nanocrystals, 170 mg of myristic acid dissolved in 1 ml of dichlorobenzene was slowly dripped in, followed by annealing at 190° C. for 10 minutes. Lastly, a ZnS shell was formed by slowly dripping in 1.2 ml of DEZ solution, 35 mg of S, 200 µA of tri-n-butylphosphine, and 2.0 ml of ODE. This was followed by annealing at 190° C. for 10 minutes.

The resulting nanocrystals of Example I-2 had a relative quantum efficiency of 63% (at room temperature) at an excitation wavelength of 469 nm. The nanocrystals had an emission peak at 537 nm and a spectral FWHM of 56 nm.

Example I-3

Preparation of Prior Art InP/ZnSe/ZnSeS/ZnS Nanocrystals

The prior art core/shell nanocrystal employs an InP core (without any smoothly varying region) and the same type of shell structure as that for the inventive nanocrystal Examples I-1 and I-2. For this example, when forming the homogeneous InP core, nearly the same amount of column III and V precursors as in Examples I-1 and I-2 was employed, but the TEGa was replaced with additional TMIn. Once again, 0.12 g of myristic acid, 45 mg of Zn undecylenate and 9 ml of ODE were loaded into a three-neck flask. The mixture was degassed at 100° C. for 1.5 hours. After switching to $N_2$ overpressure, the flask contents were heated to 300° C., while vigorously stirring its contents. The precursor solution was loaded into a single syringe and consisted of 31 mg of TMIn, 14.2 µl of $P(TMS)_3$, 52.6 µl of oleylamine, 167 µl of hexane, and 5.47 ml of ODE. When the reaction flask reached 300° C., the single syringe was quickly injected into the hot flask to form the homogeneous InP nuclei. After injecting this syringe, the flask temperature was lowered to about 270° C. and the nanocrystals were grown for 15 minutes in total. The reaction was stopped by removing the heating source.

The InP cores were also shelled with wider bandgap II-VI materials; the same acid etch and oleylamine addition was followed as for Examples I-1 and I-2.

For the first shell, 441 µl of DEZ solution (1M in hexane) and 1 ml of ODE were added dropwise to the reaction mixture under vigorous stirring; the flask contents were then annealed at 190° C. for 10 minutes to form approximately one-half monolayer of Zn. A second solution of 39 mg of Se powder, 200 µl of TBP, and 1.5 ml of ODE was then added dropwise to the reaction mixture under vigorous stirring; the flask contents were then annealed at 190° C. for 10 minutes to form approximately one-half monolayer of Se. To start the second shell, 856 µl of DEZ solution and 1 ml of ODE were added dropwise to the reaction mixture under vigorous stirring; the flask contents were then annealed at 190° C. for 10 minutes to form approximately one-half monolayer of Zn. As per Example I-1 and I-2, the same second shell chalcogen ramping was employed. This time the Se-only syringe contained 15.4 mg of Se, 92 µl of TBP, and 0.4 ml of ODE; the SeS syringe contained 12 mg of Se, 14.1 mg of S, 157 µl of TBP, and 1.2 ml of ODE. Following the drip-in of these precursors, the flask contents were then annealed at 190° C. for 10 minutes. Next, to prevent aggregation of the enlarging nanocrystals, 250 mg of myristic acid dissolved in 1.3 ml of dichlorobenzene was slowly dripped in, followed by annealing at 190° C. for 10 minutes. The ZnS shell was formed by slowly dripping in 1.26 ml of DEZ solution, 37 mg of S, 200 µl of TBP, and 2.0 ml of ODE. This was followed by annealing at 190° C. for 10 minutes.

The resulting nanocrystals of Example I-3 had a relative quantum efficiency of 62% (room temperature) at an excitation wavelength of 469 nm. The nanocrystals had an emission peak at 561 nm and a spectral FWHM of 60 nm. Another prior art nanocrystal was also synthesized following the same protocol. It had a quantum efficiency of 64%, a peak emission wavelength of 588 nm, and an emission spectral width of 63 nm.

Temperature-Dependent Photoluminescence Measurements

The temperature dependences of the PL responses of the nanocrystals (both inventive and prior art) were measured from room temperature up to about 150° C. The measurements were performed using cuvettes filled with 1 ml of the corresponding nanocrystal crude solution and 2 ml of ODE. The excitation wavelength was centered at 446 nm. Measurements were taken upon heating the solutions up to ~150° C. and back down to room temperature.

Figure 3A:
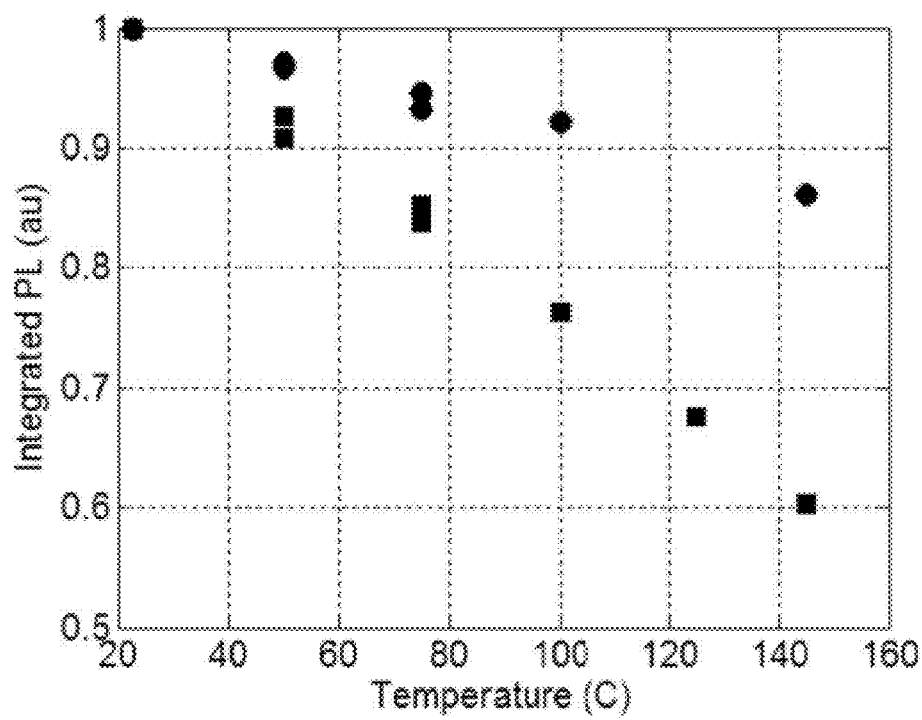
FIG. 3A shows the temperature dependent photoluminescence response of a prior art nanocrystal and a nanocrystal produced in accordance with a first embodiment of the present invention.
Figure 3B:
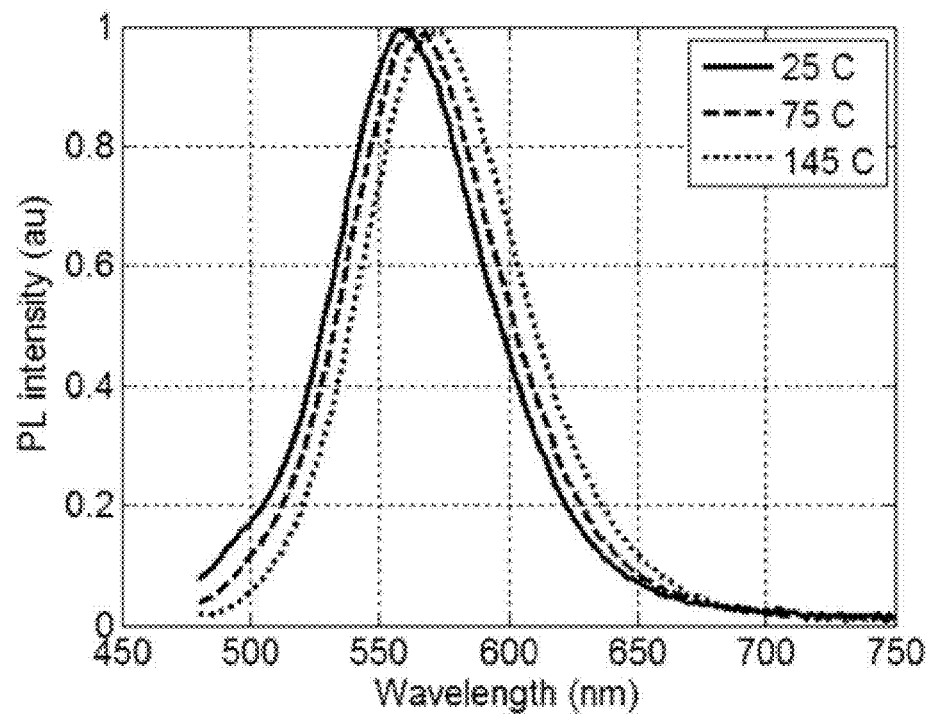
FIG. 3B shows the change in the relative shape of the PL emission of the nanocrystal produced in accordance with a first embodiment from room temperature to about 150° C.
Figure 4A:
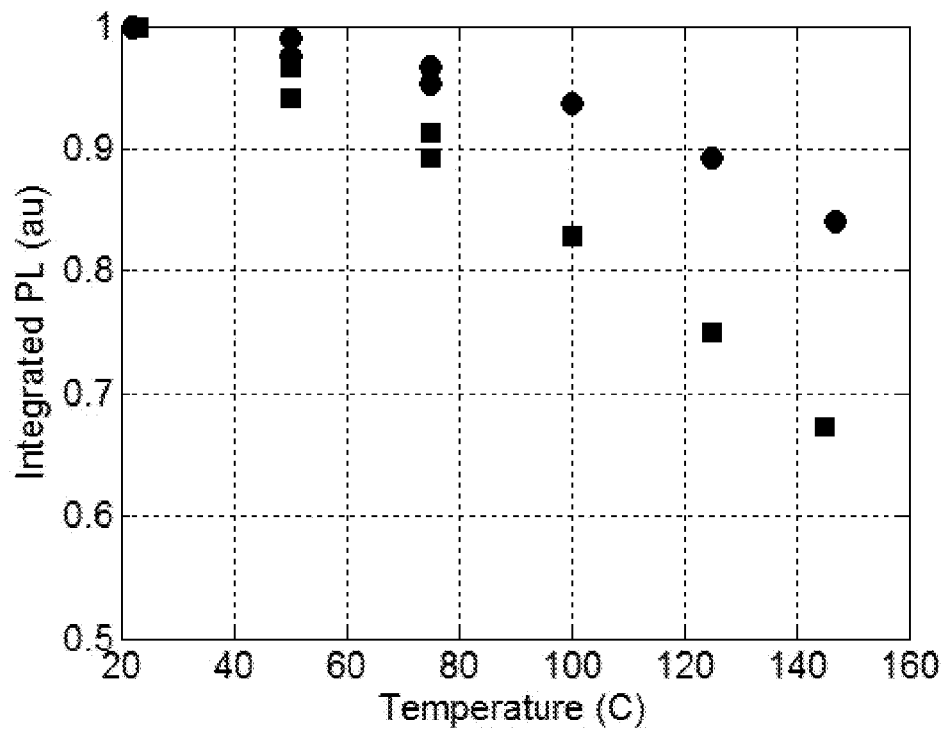
FIG. 4A shows the temperature dependent photoluminescence response of a prior art nanocrystal and a nanocrystal produced in accordance with a second embodiment of the present invention.
Figure 4B:
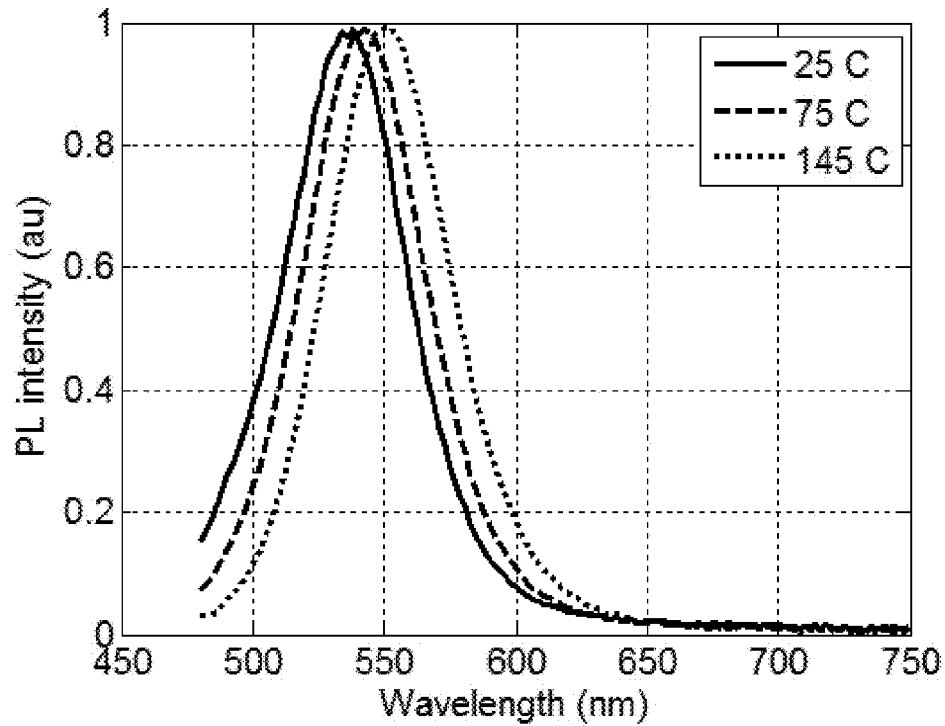
FIG. 4B shows the change in the relative shape of the PL emission of the nanocrystal produced in accordance with a second embodiment from room temperature to about 150° C.

The results of the measurements are shown in FIGS. 3A and 3B (Embodiment 1) and FIGS. 4A and 4B (Embodiment 2). FIGS. 3A and 4A plot the integrated PL response of the inventive nanocrystals (Embodiment 1 and Embodiment 2, respectively) and prior art nanocrystals as a function of temperature (circles and squares, respectively); it includes both up and down temperature data. From room temperature to ~150° C., FIG. 3A shows that the integrated PL of the nanocrystals of Embodiment 1 falls about 14% while FIG. 4A shows that the integrated PL of the nanocrystals of Embodiment 2 falls about 15%. The two figures also show that, the PL drop for the prior art nanocrystals is a factor of 2.9 (FIG. 3A) and 2.2 (FIG. 4A) larger (i.e., drops ~40% and ~33%, respectively). It should be noted that other measurements reveal that the absorbance of the inventive nanocrystals falls ~10% over that same temperature range, resulting in its overall QE dropping by about 5% from room to ~150° C. Film-based (in acrylates) temperature-dependencies of the inventive nanocrystals have also been performed; those results match well with the corresponding dependences in solution.

FIGS. 3B and 4B (Embodiment 1 and Embodiment 2, respectively) show the changes in the relative shape of the inventive nanocrystal emission from room temperature to about 150° C. Both figures reveal a red-shift of the peak emission wavelength of ~12 nm; this magnitude of red shift is common for nanocrystal emitters.

Figure 4C:
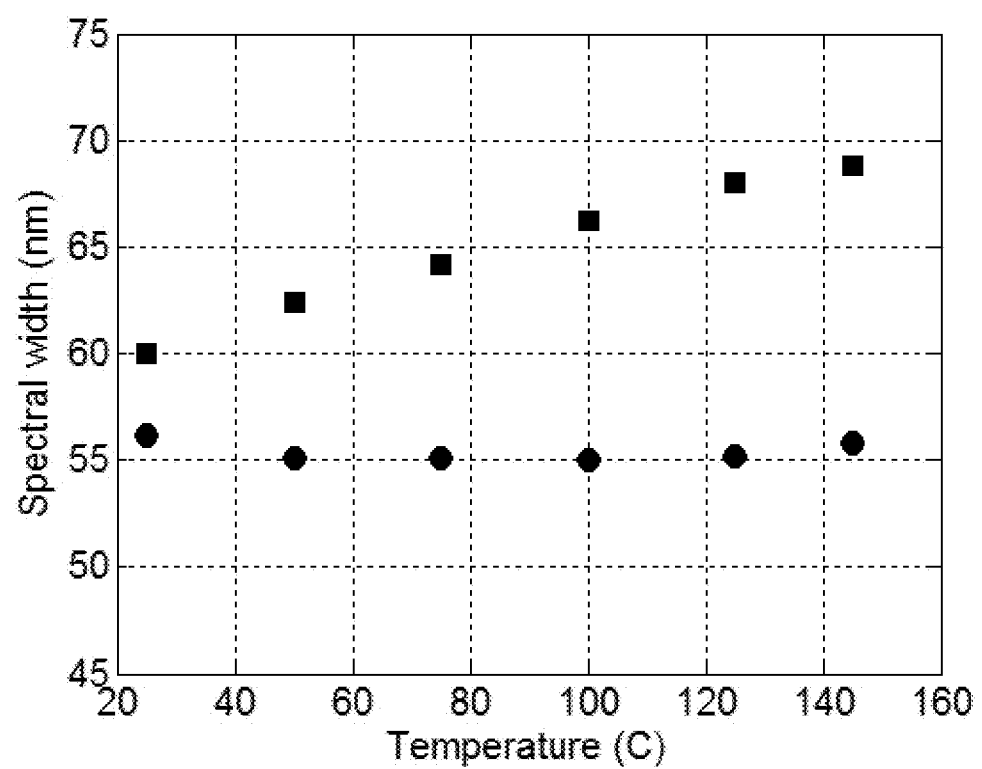
FIG. 4C compares the emissive thermal broadening of the nanocrystals produced in accordance with a second embodiment with that of prior art nanocrystals.

FIG. 4C compares the emissive thermal broadening of the inventive nanocrystals produced in accordance with Embodiment 2 with that of the prior art nanocrystals, circles and squares, respectively. The prior art nanocrystals show typical [A. Narayanaswamy et al., J. Phys. Chem. C112, 6775 (2008)] linear dependence (over this temperature range) of the thermal broadening with temperature, while the inventive nanocrystals have effectively no change in emission spectral width. Unlike the red shift of the emission peak, it is highly unique and unexpected that the inventive nanocrystals show no thermal broadening over this temperature range. Since the change in spectral width with temperature from 25° C. to 150° C. is typically associated with the optical phonons, these results show that the optical phonon interaction is reduced for the inventive nanocrystals.

As discussed in the background, large thermal quenching of nanocrystals is commonplace [Zhao et al., ACS Nano 6, 9058 (2012)]. Accordingly, FIGS. 3 and 4 reveal that the inventive nanocrystals have significantly better thermal stability relative to both the prior-art, InP-based nanocrystals and prior-art CdSe-based nanocrystals. Combining the highly reduced thermal quenching with the lack of spectrally broadening, these results support the previous comments that enhancing the confinement of the electrons and holes to the homogeneous region 205 reduces not only the nanocrystal's electron-phonon interaction, but also prevents the electrons/holes from interacting with the nanocrystal surface where thermal quenching effects are more dominant.

Flux-Dependent (cw) Photoluminescence Measurements

Figure 5A:
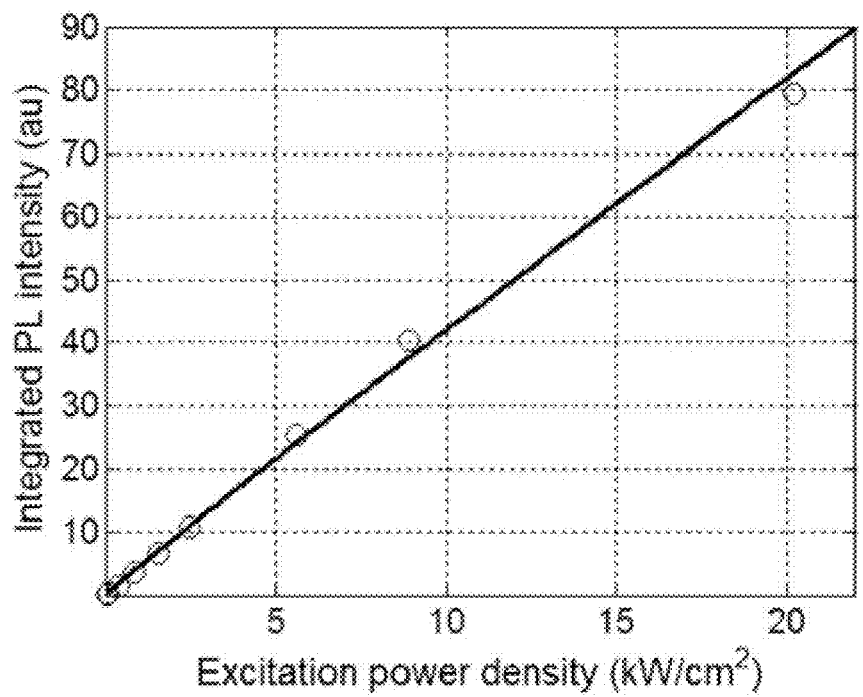
FIG. 5A shows a photoluminescence response for nanocrystals produced in accordance with a first embodiment.
Figure 5B:
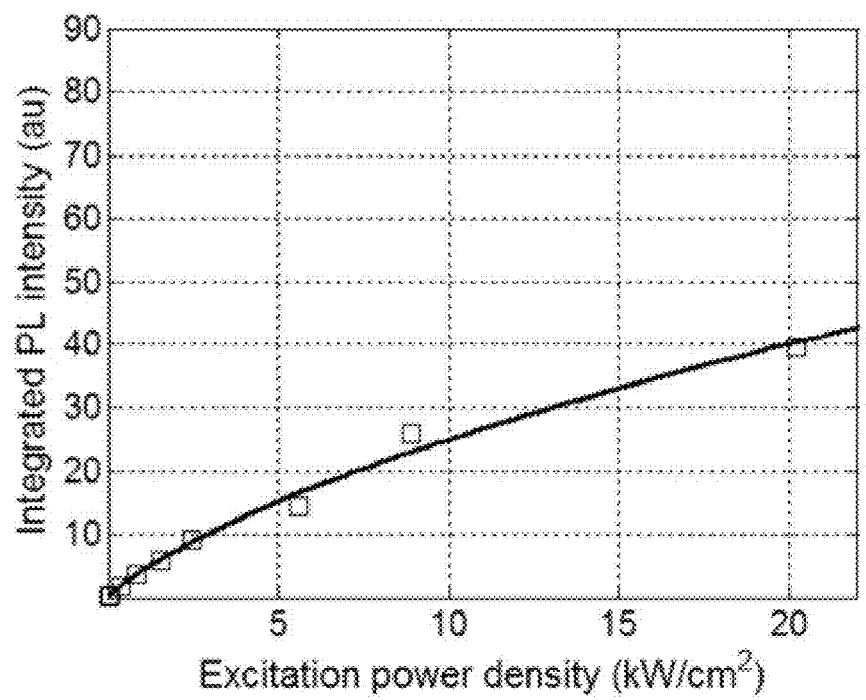
FIG. 5B shows a photoluminescence response for prior art nanocrystals.

The excitation power density dependence of the PL response of nanocrystals produced in accordance with Embodiment 1 and prior art nanocrystals was also determined. The measurements were performed by putting dilute solutions of the nanocrystals into a 1 mm cuvette (optical density of about 0.06). The excitation source was a 120 mW cw 406 nm laser diode. Using a 75 mm focal length lens, the average laser spot area ($1/e^2$) within the 1 mm cuvette was ~370 μm². Using neutral density filters, the power densities were lowered by over four orders of magnitude to about 1 W/cm², while the highest power density was ~20 kW/cm². FIGS. 5A and 5B compare the responses of the inventive and prior-art nanocrystals, respectively; the circle and squares are the respective data while the solid lines in each figure are linear and polynomial fits to the data, respectively. To eliminate differences in QE and sample absorbance, the integrated PL intensities have been scaled such that the responses at the lowest power density values are identical. Consequently, the PL intensities for the two samples can be compared in an absolute sense. FIG. 5 shows that there is a large difference between the prior art and inventive nanocrystals in terms of their PL responses. The prior art sample shows typical saturation of the PL due to Auger recombination at higher excitation power densities (the sample response was verified to be stable in time), while the inventive sample is almost completely linear in PL response over four orders of magnitude. This difference in behavior results in the two PL intensities differing by a factor of two at the highest power density.

Time Resolved Photoluminescence Data

In order to provide additional evidence for the reduction of Auger recombination, both the inventive nanocrystals and prior-art nanocrystals were excited by a fs-pulsed laser and then monitored for the decay of the photoluminescence. More particularly, dilute solutions of each of the nanocrystals were placed into 1 mm cuvettes (optical density of about 0.06). The nanocrystals were excited at 400 nm by the second harmonic of an amplified mode-locked Ti-Sapphire laser. The laser pulse width was ~200 fs at a repetition rate of 250 kHz. The excitation intensity was varied using neutral density filters. Using a 400 mm lens, the laser beam was focused to a $1/e^2$ radius of about 50 μm (resulting in an upper average power density of about 400 W/cm²). The time evolution of the PL from the samples was measured using a streak camera with a resolution of ~15 ps.

Figure 6A:
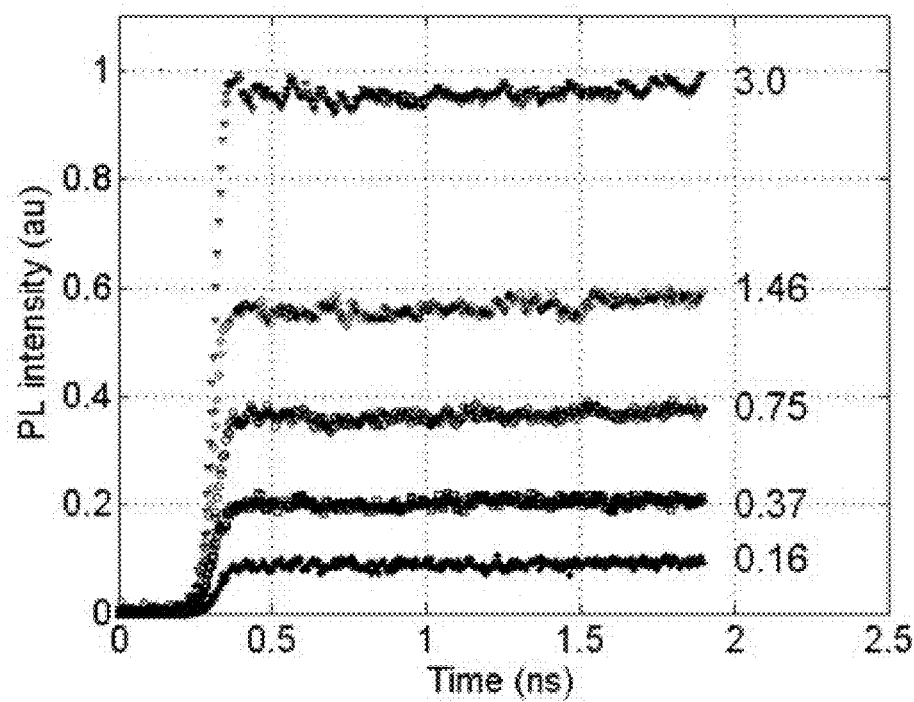
FIG. 6A shows a time resolved photoluminescence response for nanocrystals produced in accordance with a first embodiment.
Figure 6B:
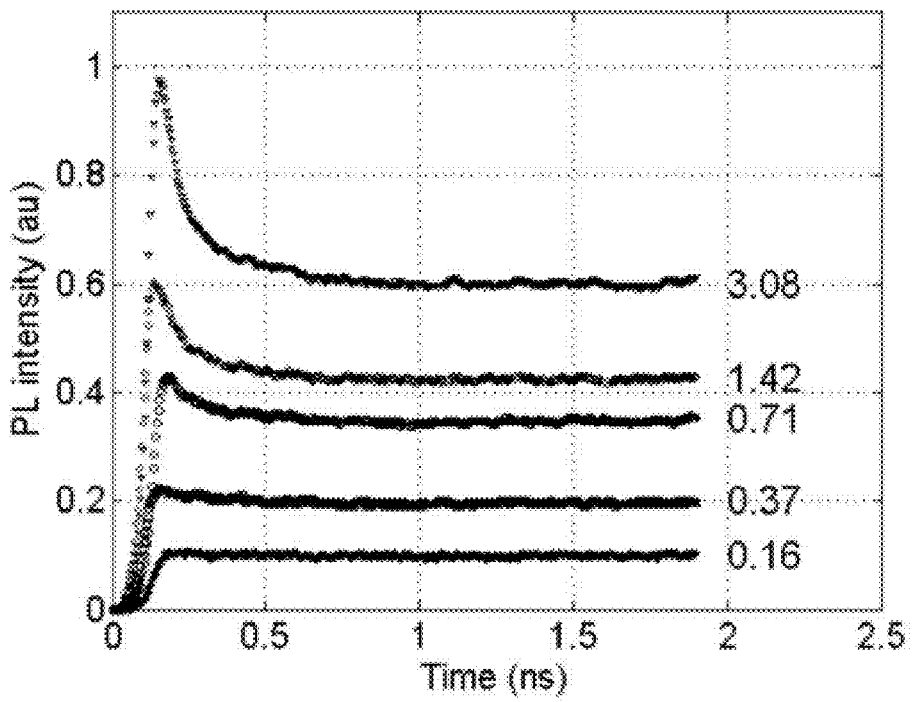
FIG. 6B shows a time resolved photoluminescence response for prior art nanocrystals.
Figure 7A:
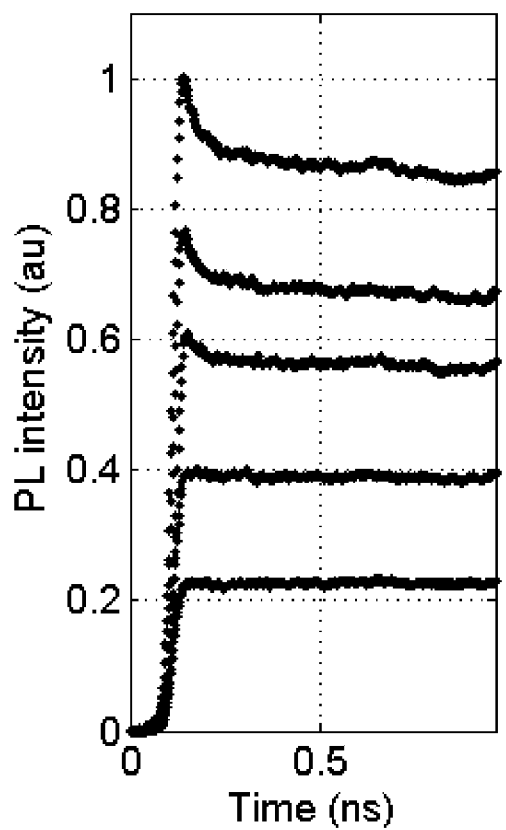
FIG. 7A shows a time resolved photoluminescence response for nanocrystals produced in accordance with a second embodiment.
Figure 7B:
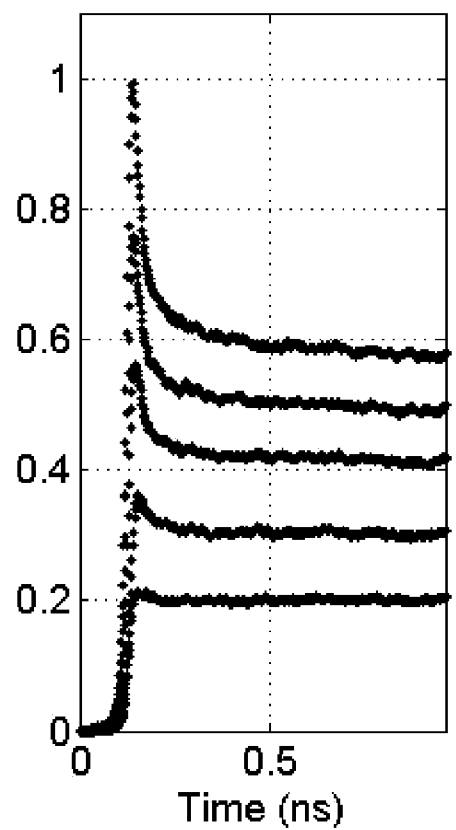
FIG. 7B shows a time resolved photoluminescence response for prior art nanocrystals.

FIGS. 6A and 6B compare the time resolved PL (TRPL) response (integrated over wavelength), for a 2 ns time window, of the nanocrystals produced in accordance with Embodiment 1 and prior art nanocrystals, respectively, while FIGS. 7A and 7B compare the TRPL response, for a 1 ns time window, of the nanocrystals produced in accordance with Embodiment 2 and prior art nanocrystals, respectively.

In FIGS. 6 and 7, the various time-averaged excitation power density levels are ~20, 50, 100, 200, and 400 W/cm². Each of FIGS. 6A and 6B and FIGS. 7A and 7B show very clearly the difference in the TRPL responses of the nanocrystals produced in accordance with the present invention and prior art nanocrystals. The prior-art nanocrystal's response is indicative of conventional nanocrystals (large PL decay during the initial 300-400 ps due to Auger recombination, especially at the higher excitation power densities), while the inventive nanocrystal samples of FIGS. 6A and 7A show either no PL decay or a much smaller degree of PL decay for short time scales for the highest power densities, indicating that Auger recombination is highly suppressed in the inventive samples. Figures having the same overall features are also obtained when one plots the TRPL at the peak of the PL response, thus eliminating the impact of defect-driven recombination on the TRPL responses.

In order to convert the average excitation power densities into the average number of e-h pairs (excitons) generated, <N>, we used the typical expression of $<N>=j_p\sigma$ [V. Klimov et al., Science 290, 314 (2000)], where $j_p$ is the excitation power density and σ is the absorption cross-section. Due to the emission wavelengths of the nanocrystals of FIG. 6 being about 20 nm longer than the nanocrystals of FIG. 7, the absorption cross-sections of the former nanocrystals were larger by factor of ~1.5. The resulting calculated <N> values were ~0.16, 0.37, 0.73, 1.44, and 3.05 e-h pairs, respectively, for FIG. 6 and ~0.1, 0.26, 0.53, 1.05, and 2.1 e-h pairs, respectively, for FIG. 7. Overall the data from FIGS. 3, 5, and 6 (Embodiment 1) and FIGS. 4 and 7 (Embodiment 2) show clear advantages for both the temperature and high flux responses of the inventive nanocrystals as compared to that for conventional nanocrystals. Accordingly, these results show that the inventive nanocrystals would exhibit superior performance when used for both solid state lighting and high optical flux applications.

Determination of the InGaP Profile

With regard to the inventive nanocrystals, the actual radial Ga mole fraction profile (as per FIG. 2) was determined by the following procedure. The tight confinement nanocrystals 200 took 15 minutes to grow to completion as discussed in Examples I-1 and I-2. Aliquots were removed after 0.5, 1, 2, 4, 8, 12 and 15 minutes from the reaction vessel. For each of these aliquots we measured the UV-VIS absorbance and molar density of In and Ga by ICP-OES. The corresponding absorption exciton peaks were used to determine the size (diameter) of the nanocrystals. However, this correlation data [R. Xie et al., J. Amer. Chem. Soc. 131, 15457 (2009)] only exists for pure InP cores.

To use this data we assumed that the functional dependence of diameter on the exciton absorption peak position remained the same (going from InP nanocrystals to InGaP nanocrystals), but that the overall scaling factor was increased (since InGaP nanocrystals having the same absorption peak as InP nanocrystals need to be larger due to the bulk material having a larger bandgap). The scaling factor was determined by comparing the actual diameter of the nanocrystals after 15 minutes (~3.2 nm from TEM images) to the value obtained from the InP exciton absorption correlation data (~2 nm). Combining the ICP analysis results with these derived diameters yielded FIG. 8a, which shows the average Ga mole fraction (since ICP measures the volume averaged Ga and In molar densities) as a function of the nanocrystal diameter. In the figure the squares are the data while the solid line is a theoretical fit to the data using the parameterized model discussed below.

Two additional data points were added to the figure beyond the measured aliquot values: 1) At a diameter of 0, the Ga mole fraction was taken to be zero and 2) the diameter of 1.2 nm was taken to be the extent of the InP homogeneous region 205. With regard to the latter value, we extracted the InP homogeneous region 205 size by stopping the growth via injecting 10 ml of cold ODE immediately after syringe 1 in the inventive embodiments. Those resulting nanocrystals had a measured exciton absorption peak of about 425 nm which corresponds to a diameter of about 1.3 nm. We lowered the actual InP size to 1.2 nm (8% lower) to take into account the slight delay in shutting down the growth process upon injection of the cold ODE.

Figure 8A:
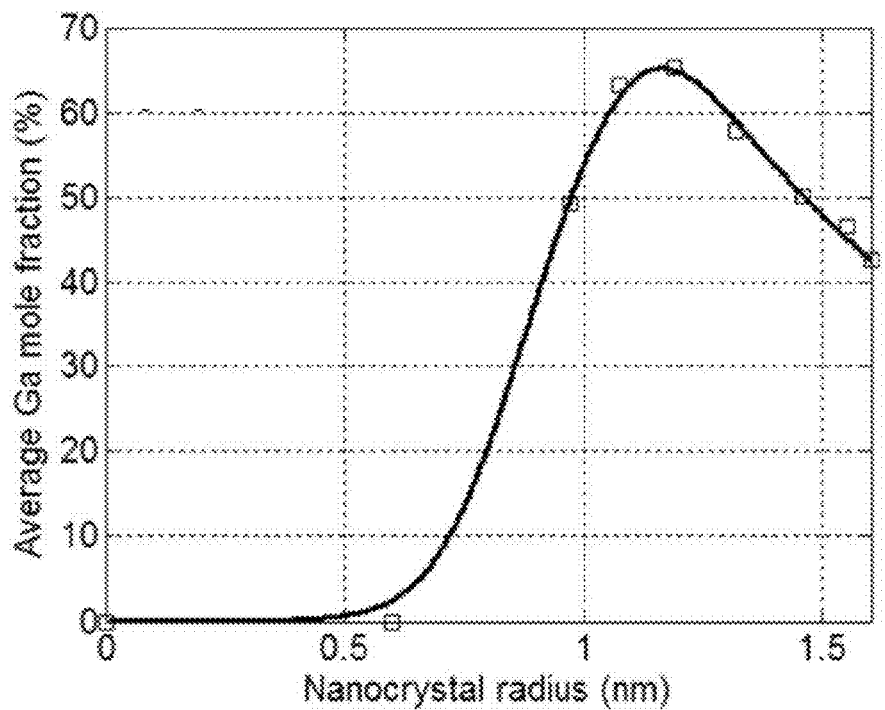
FIG. 8A shows the measured and calculated average Ga mole fraction for the inventive nanocrystals.
Figure 8B:
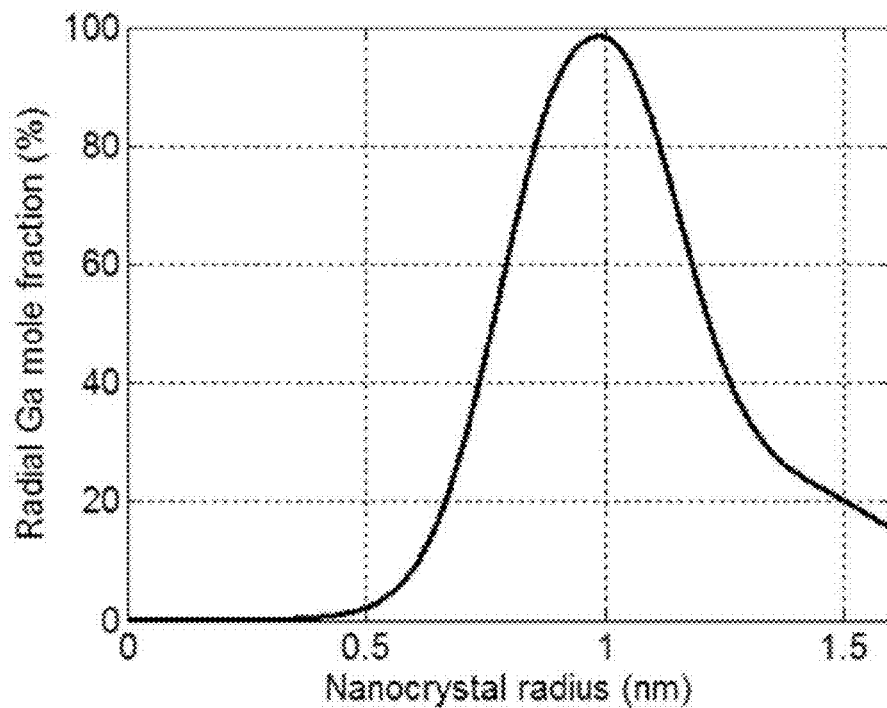
FIG. 8B shows the calculated radially-varying Ga mole fraction of the inventive nanocrystals.

Next we determined the functional form for the radial Ga mole fraction profile which when averaged over the appropriate nanocrystal volumes yielded the corresponding average Ga mole fraction values (as in FIG. 8a). We chose a sum of Gaussians; this resulted in 7 fitting parameters and 9 data points. FIG. 8b shows the derived radially-varying Ga mole fraction profile, while the solid line in FIG. 8a is the predicted average Ga mole fraction based on integrating the profile from FIG. 8b. FIG. 8a shows that our simple Gaussian model predicts the data quite well. FIG. 8b shows that the predicted Ga mole fraction for nanocrystals grown using the inventive embodiments is similar to the general shape illustrated in FIG. 2. As can be seen, the peak of the Ga distribution occurred about 0.4 nm from the edge of the InP region.

Figure 8C:
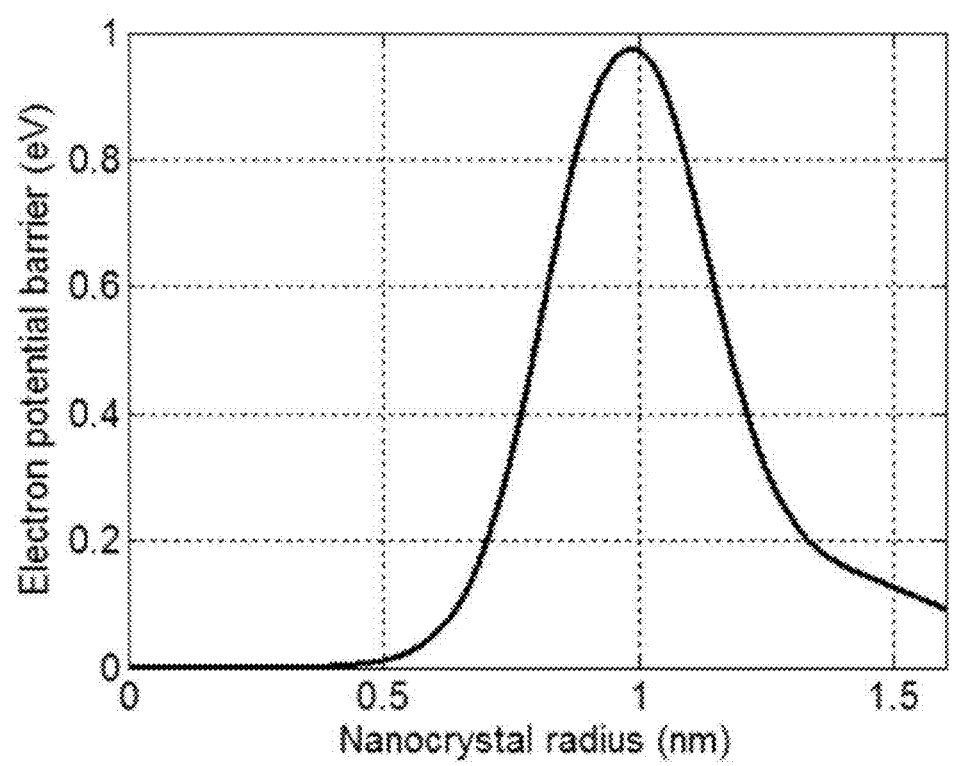
FIG. 8C shows the calculated electron potential energy barrier for the inventive nanocrystals.

FIG. 8c shows the derived electron potential barrier using the previously discussed methodology. As can be seen, it is analogous in functional form to the radial Ga profile, with the potential barrier having a FWHM of ~0.3 nm. The corresponding potential barrier for the holes has the same shape, just lower in magnitude. FIG. 8b also shows that the radial Ga mole fraction is in excess of 70%, where the alloy becomes indirect (momentum is not conserved). The impact of this direct-indirect transition will be to limit the height of the InGaP-based potential barrier, as discussed above. However, this added complexity is not taken into account when computing the electron barrier of FIG. 8c. Overall these results show that the general functional form for the radial Ga mole fraction (see FIG. 2) and potential barrier (see FIG. 1b) are realistic. However, other related forms are valid as long as they fit within the general description for the varying element(s) and potential barrier as described above.

What is claimed is:

1. A nanocrystal comprising:
   a) a homogeneous region having a first composition; and
   b) a smoothly varying region encompassing the homogeneous region and having a second composition wherein a confining potential barrier monotonically increases and then monotonically decreases as the smoothly varying region extends from the surface of the homogeneous region to an outer surface of the nanocrystal.

2. The nanocrystal of claim 1 wherein the confining potential barrier increases to its maximum closer to the surface of the homogeneous region than to the surface of the nanocrystal.

3. The nanocrystal of claim 1 wherein the smoothly varying region does not have any discontinuities in its radial profile.

4. The nanocrystal of claim 1 wherein the homogeneous region has a diameter between about 0.05 and about 0.15 Bohr radii and the smoothly varying region has thickness between about 0.05 and about 0.30 Bohr radii.

5. The nanocrystal of claim 1 wherein the homogeneous region consists of a single-component, binary or ternary semiconductor material of type IV, II-VI, III-V, IV-VI or a combination thereof.

6. The nanocrystal of claim 1 wherein the smoothly varying region consists of a binary, ternary or quaternary semiconductor material of type IV, II-VI, III-V or IV-VI or a combination thereof.

7. The nanocrystal of claim 1 further comprising:
   c) at least one shell layer having a third composition formed around the outer surface of the smoothly varying region.

8. The nanocrystal of claim 7 wherein the at least one shell layer comprises a wider bandgap semiconductor material compared to that of the first composition and the second composition.

9. A nanocrystal comprising:
   a) a homogeneous region having a first composition; and
   b) a smoothly varying region encompassing the homogeneous region and having a second composition wherein a mole fraction of one or more varying elements monotonically increases and then monotonically decreases as the smoothly varying region extends from the surface of the homogeneous region to an outer surface of the nanocrystal.

* * * * *